(12) United States Patent
Yanagida et al.

(10) Patent No.: US 9,674,995 B2
(45) Date of Patent: Jun. 6, 2017

(54) COMPONENT SUPPLY UNIT

(71) Applicant: YAMAHA HATSUDOKI KABUSHIKI KAISHA, Shizuoka-ken (JP)

(72) Inventors: Tsutomu Yanagida, Kumagaya (JP); Kazuyoshi Ohyama, Kumagaya (JP); Yutaka Chida, Kumagaya (JP); Yuuki Tomita, Kumagaya (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 0 days.

(21) Appl. No.: 14/659,774

(22) Filed: Mar. 17, 2015

(65) Prior Publication Data

US 2015/0189801 A1 Jul. 2, 2015

Related U.S. Application Data

(63) Continuation of application No. PCT/JP2013/065027, filed on May 30, 2013.

(30) Foreign Application Priority Data

Sep. 28, 2012 (JP) ................. 2012-218832

(51) Int. Cl.
G07F 11/66 (2006.01)
H05K 13/02 (2006.01)
(Continued)

(52) U.S. Cl.
CPC ......... H05K 13/02 (2013.01); H05K 13/0084 (2013.01); H05K 13/0417 (2013.01)

(58) Field of Classification Search
CPC .. B26D 1/0006; H05K 13/02; H05K 13/0084; H05K 13/0417
(Continued)

(56) References Cited

U.S. PATENT DOCUMENTS 1,986,277 A * 1/1935 McLean ................ B23D 63/10
76/32
3,422,915 A * 1/1969 Watts ..................... E21B 10/44
175/388
(Continued)

FOREIGN PATENT DOCUMENTS

CN 101163391 A 4/2008
CN 101790302 A 7/2010
(Continued)

OTHER PUBLICATIONS

The extended European search report issued by the European Patent Office on Nov. 9, 2015, which corresponds to European Patent Application No. 138400249.0-1803 and is related to U.S. Appl. No. 14/659,774.

(Continued)

Primary Examiner — Rakesh Kumar
(74) Attorney, Agent, or Firm — Studebaker & Brackett PC

(57) ABSTRACT

To provide a component supply unit capable of reliably cutting a cover tape and reliably exposing an electronic component when using a new storage tape and supplying the electronic component. A tape processing unit includes a cutter successively cutting a cover tape of a storage tape along a traveling direction following traveling of this storage tape. The cutter includes a blade portion having an angular blade portion so inclined frontwardly downward that a blade is angularly formed, and an upper C-chamfered surface (upper worked surface) which is a flat portion whose width in the horizontal direction gradually narrows from a lower end upwardly to reach the angular blade portion on an upper end formed on a forward end portion of this blade portion.

8 Claims, 26 Drawing Sheets

(51) Int. Cl.
*H05K 13/04* (2006.01)
*H05K 13/00* (2006.01)

(58) Field of Classification Search
USPC .................................... 221/25; 30/346.55
See application file for complete search history.

(56) References Cited

U.S. PATENT DOCUMENTS

| | | | | |
|---|---|---|---|---|
| 3,682,034 | A * | 8/1972 | Pearl | B26F 1/382 |
| | | | | 83/528 |
| 4,365,957 | A * | 12/1982 | Das | A61C 3/02 |
| | | | | 433/144 |
| D332,309 | S * | 1/1993 | Detsch | D24/146 |
| 6,099,543 | A * | 8/2000 | Smith | A61F 9/0133 |
| | | | | 606/167 |
| 6,162,007 | A * | 12/2000 | Witte | B65H 20/22 |
| | | | | 221/211 |
| 6,368,045 | B1 * | 4/2002 | Ashman | B65H 20/22 |
| | | | | 414/403 |
| 6,497,712 | B1 * | 12/2002 | Feaster | A61F 9/0133 |
| | | | | 606/166 |
| 6,554,840 | B2 * | 4/2003 | Matsutani | A61F 9/0133 |
| | | | | 606/107 |
| 6,751,876 | B2 * | 6/2004 | Herold | B26D 3/065 |
| | | | | 30/484 |
| 6,948,541 | B2 * | 9/2005 | Bergstrom | H05K 13/0417 |
| | | | | 156/701 |
| 6,962,000 | B2 * | 11/2005 | Teeuw | B26B 21/60 |
| | | | | 30/346.5 |
| 7,060,367 | B2 * | 6/2006 | Yamada | B26B 21/56 |
| | | | | 30/346.53 |
| D578,847 | S * | 10/2008 | Mashburn | D8/20 |
| 7,601,163 | B2 * | 10/2009 | Booth | A61B 17/3211 |
| | | | | 30/355 |
| 7,824,382 | B2 * | 11/2010 | Reihl | A61B 5/14528 |
| | | | | 604/264 |
| 7,841,091 | B2 * | 11/2010 | Melton | B26B 19/3846 |
| | | | | 30/223 |
| 7,850,040 | B2 * | 12/2010 | Davis | H05K 13/0417 |
| | | | | 221/72 |
| 7,963,042 | B2 * | 6/2011 | Keller | A61B 17/3211 |
| | | | | 30/350 |
| 7,988,693 | B2 * | 8/2011 | Martz | A61B 17/1604 |
| | | | | 606/84 |
| 8,142,366 | B2 * | 3/2012 | Haar | A61B 5/150022 |
| | | | | 600/583 |
| 8,186,064 | B2 * | 5/2012 | Pragt | B26B 19/06 |
| | | | | 30/208 |
| 8,353,424 | B2 * | 1/2013 | Ikeda | H05K 13/021 |
| | | | | 156/941 |
| D679,397 | S * | 4/2013 | Packard | D24/146 |
| 8,499,673 | B2 * | 8/2013 | Keller | A61B 17/3211 |
| | | | | 30/314 |
| 8,832,946 | B2 * | 9/2014 | Howdeshell, II | B26D 1/0006 |
| | | | | 225/2 |
| 8,834,504 | B2 * | 9/2014 | Hoerauf | A61B 5/1411 |
| | | | | 606/181 |
| 9,420,736 | B2 * | 8/2016 | Kitani | H05K 13/0417 |
| 2002/0188310 | A1 * | 12/2002 | Seward | A61B 17/205 |
| | | | | 606/185 |
| 2004/0016128 | A1 * | 1/2004 | Yanosaka | B26B 19/06 |
| | | | | 30/225 |
| 2006/0030788 | A1 * | 2/2006 | Wong | A61B 5/14514 |
| | | | | 600/583 |
| 2007/0241028 | A1 | 10/2007 | Larsson et al. | |
| 2008/0093375 | A1 | 4/2008 | Davis et al. | |
| 2010/0186901 | A1 | 7/2010 | Ikeda et al. | |
| 2011/0036058 | A1 | 2/2011 | Howdeshell, II et al. | |
| 2012/0116437 | A1 * | 5/2012 | Horauf | A61B 5/1411 |
| | | | | 606/181 |
| 2013/0192441 | A1 * | 8/2013 | Ehrle | B23K 10/027 |
| | | | | 83/651 |
| 2013/0283624 | A1 * | 10/2013 | Scimone | B26B 21/56 |
| | | | | 30/346.55 |
| 2014/0360333 | A1 * | 12/2014 | Sprow | B26D 7/2614 |
| | | | | 83/698.11 |
| 2015/0158193 | A1 * | 6/2015 | Chang | B26D 1/0006 |
| | | | | 83/698.11 |
| 2015/0158194 | A1 * | 6/2015 | Krauss | B26D 1/0006 |
| | | | | 83/13 |
| 2015/0189801 | A1 * | 7/2015 | Yanagida | H05K 13/0417 |
| | | | | 221/25 |
| 2015/0266194 | A1 * | 9/2015 | Ledergerber | B26D 1/06 |
| | | | | 83/315 |
| 2015/0273706 | A1 * | 10/2015 | Martin | B26B 9/02 |
| | | | | 30/351 |

FOREIGN PATENT DOCUMENTS

| | | | | |
|---|---|---|---|---|
| CN | 101939148 A | | 1/2011 | |
| EP | 1530414 A1 | | 5/2005 | |
| EP | 2211600 A2 * | | 7/2010 | .......... H05K 13/021 |
| JP | 2008-098499 A | | 4/2008 | |
| JP | 2010-003714 A | | 1/2010 | |
| JP | 2011-029260 A | | 2/2011 | |
| SE | EP 1530414 A1 * | | 5/2005 | .......... H05K 13/021 |

OTHER PUBLICATIONS

An Office Action; "Notice of Reasons for Rejection," issued by the Japanese Patent Office on Feb. 2, 2016, which corresponds to Japanese Patent Application No. 2014-538226 and is related to U.S. Appl. No. 14/659,774.

An Office Action issued by the Korean Patent Office on Jan. 12, 2016, which corresponds to Korean Patent Application No. 10-2015-7008608 and is related to U.S. Appl. No. 14/659,774.

A First Office Action issued by the Chinese Patent Office on Jul. 4, 2016, which corresponds to Chinese Patent Application No. 201380050881.1 and is related to U.S Appl. No. 14/659,774, with English language translation.

The second Office Action issued by the Chinese Patent Office on Mar. 1, 2017, which corresponds to Chinese Patent Application No. 201380050881.1 and is related to U.S. Appl. No. 14/659,774, with English language translation.

* cited by examiner

COMPONENT SUPPLY UNIT

CROSS-REFERENCE TO RELATED APPLICATIONS

This application claims benefit of priority to Japanese Patent Application No. 2012-218832 filed Sep. 28, 2012, and to International Patent Application No. PCT/JP2013/065027 filed on May 30, 2013, the entire content of each of which is incorporated herein by reference.

TECHNICAL FIELD

The present technical field relates to a component supply unit supplying electronic components stored in storage portions of a storage tape to a component extraction position by movement of the storage tape.

BACKGROUND

In a conventional component supply unit, a storage tape for electronic components fed to a component extraction position is pressed by a suppressor which is a pressing device from above to minimize movement of the storage tape in the vertical direction, so that the electronic components are reliably extracted in a stable state, as disclosed in Japanese Patent Laying-Open No. 2011-21693 or the like, for example. When a new storage tape is loaded on the component supply unit, the storage tape is pushed from an upstream side toward a downstream side by driving of a sprocket which is a tape feeding device, and fed in the component supply unit. The suppressor has a cutter which is a cutting unit cutting a cover tape covering an upper surface of the storage tape, and a blade portion is formed on the cutter from a forward end backward in an oblique upward direction. The fed cover tape is cut at an upward position beyond a lower end (forward end) of the blade portion of the cutter, horizontally cut and widened toward both horizontal sides, so that exposed electronic components are fed to an outlet port.

When an end surface of the new storage tape hits the forward end of the cutter and the cover tape is cut with the blade portion, however, there is an apprehension that the blade portion staves the cover tape when a cutting start position for the cover tape lowers from the upward position beyond the forward end of the blade portion and the start position becomes the forward end of the blade portion, and when the former staves the latter, there is an apprehension that a lower surface of the blade portion runs onto the cover tape, i.e., onto the storage tape and cutting of the cover tape is not performed. There has been an apprehension that such a problem arises when supply of the electronic components from the component supply unit stops as a result of this.

SUMMARY

Accordingly, the present disclosure aims at providing a component supply unit capable of reliably cutting a cover tape and reliably exposing electronic components when using a new storage tape and supplying the electronic components.

Therefore, a first disclosure is characterized in that a component supply unit intermittently supplies an electronic component stored in a storage portion of a storage tape to a component extraction position by rotation of a sprocket tape while a feeding tooth thereof fits with a feeding hole formed on the storage tape. The invention includes a tape processing unit including a cutter successively cutting a cover tape covering the storage portion of the storage tape along a traveling direction following traveling of this storage tape and a guide surface guiding the cover tape cut by this cutter to successively cut open the cover tape following the traveling of the storage tape. The cutter includes a blade portion including an angular blade portion so inclined frontwardly downward that a blade is angularly formed. A flat portion whose width in the horizontal direction gradually narrows from a lower end upward to reach the angular blade portion on an upper end is formed on a forward end portion of this blade portion.

A second disclosure is characterized in that a component supply unit intermittently supplies an electronic component stored in a storage portion of a storage tape to a component extraction position by rotation of a sprocket while a feeding tooth thereof fits with a feeding hole formed on the storage tape. This invention includes a tape processing unit including a cutter successively cutting a cover tape covering the storage portion of the storage tape along a traveling direction following traveling of this storage tape and a guide surface guiding the cover tape cut by this cutter to successively cut open the cover tape following the traveling of the storage tape. The cutter includes a blade portion including an angular blade portion so inclined frontwardly downward that a blade is angularly formed. A flat portion directed upward from a lower end for guiding the cover tape up to the edge angular blade portion is formed on a forward end portion of this blade portion.

A third disclosure is characterized in that the flat portion is in the form of an isosceles triangle having a lower end of the angular blade portion as a vertex.

The present disclosure can provide a component supply unit capable of reliably cutting a cover tape and reliably exposing electronic components when using a new storage tape and supplying the electronic components.

DETAILED DESCRIPTION

Figure 1:
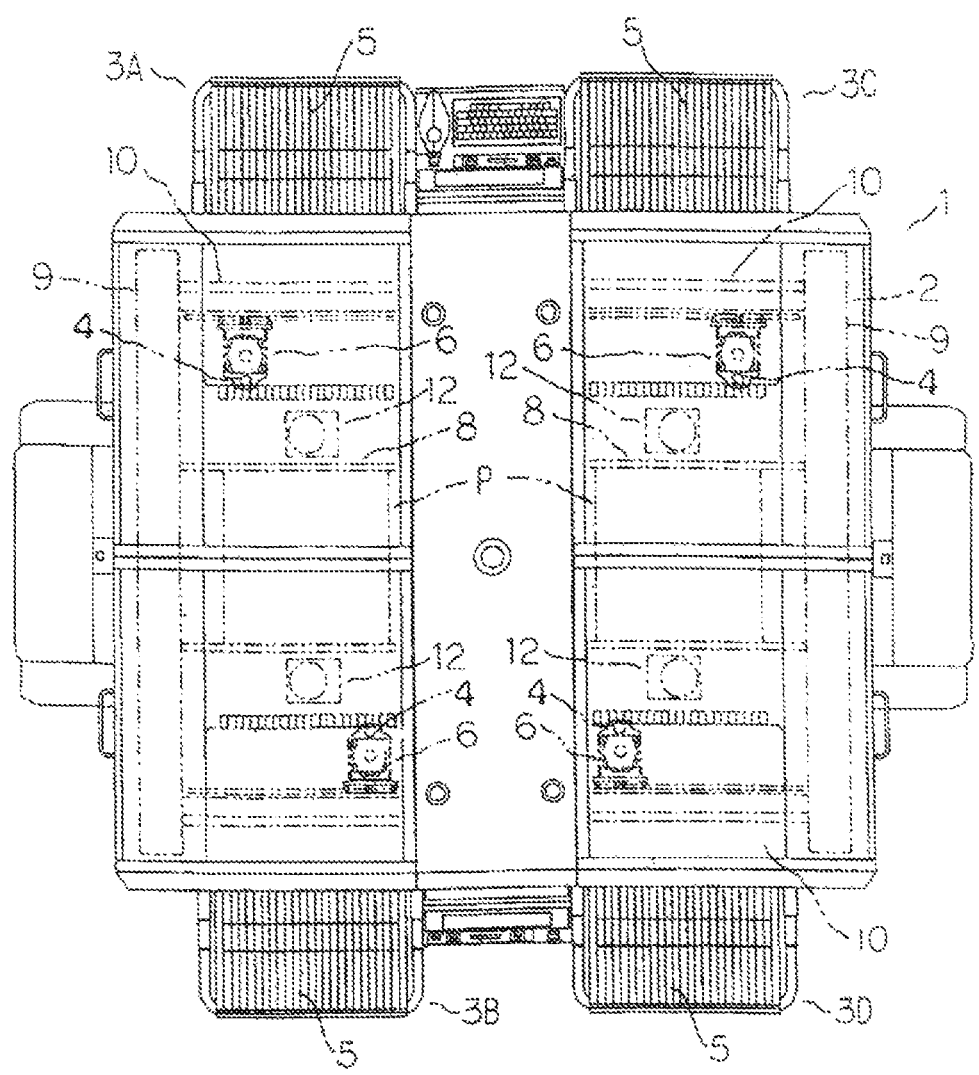
FIG. 1 is a plan view of an electronic component mounting device.

An embodiment of the present disclosure is now described on the basis of FIG. 1, which is a plan view of an electronic component mounting device. First, a plurality of component supply devices 3A, 3B, 3C and 3D are parallelly provided in four blocks on a front portion and a rear portion of a device body 2 of the electronic component mounting device 1.

Each of the respective component supply devices 3A, 3B, 3C and 3D is prepared by parallelly providing a large number of component supply units 5 on a feeder base of a cart base which is a mount, and attachably/detachably arranged on the device body 2 through a coupler so that a forward end portion on a component supply side faces a transportation path for printed boards P as substrates, and has such a structure that power is supplied to the component supply units 5 loaded on the cart base when the cart base is normally mounted on the device body 2 and the same is movable through a caster provided on a lower surface when the coupler is released and a handle is pulled.

In a case of canceling connection between connectors connected to a power source in order to extract any component supply unit 5 from the feeder base, the power supplied to this component supply unit 5 is cut off so that a control unit 70 described later can detect this cutoff state, and when contrarily inserting and mounting the component supply unit 5 into and on the feeder base and connecting the connectors with each other, power is supplied to this component supply unit 5 and the control unit 70 described later can detect this supply state.

Each of the respective component supply devices 3A, 3B, 3C and 3D is so arranged that the forward end portion on the component supply side faces a component adsorption/extraction position PU which is a component extraction region of a mounting head 6.

Supply conveyors, first positioning portions, intermediate conveyors, second positioning portions and discharge conveyors constituting substrate transport devices 8 transporting the printed boards P as the substrates are provided between the component supply devices 3B and 3D on the front side and the component supply devices 3A and 3C on the back side.

The supply conveyors transport the printed boards P received from an upstream side to the first positioning portions, transport the same to the intermediate conveyors after mounting electronic components on the substrates P positioned by unillustrated positioning mechanisms on these respective positioning portions and position the printed boards P received from these intermediate conveyors on the second positioning portions by the positioning mechanisms for mounting the electronic components. Thereafter the printed boards P are transported to the discharge conveyors and thereafter transported to a downstream-side device.

Each beam 10 moving along a guide rail 9 in a Y direction by a Y-axis driving motor 11 is provided with the mounting head 6 moving in the longitudinal direction thereof, i.e., in an X direction by an X-axis driving motor 13, and this mounting head 6 is provided with a plurality of adsorption nozzles 7 which are component extractors. The mounting head 6 is loaded with a vertical axis driving motor 14 for vertically moving the adsorption nozzles 7, and loaded with a θ-axis driving motor 15 for rotating the same along perpendicular axes. Therefore, the adsorption nozzles 7 of the mounting head 6 are movable in the X direction and the Y direction, rotatable about the perpendicular axes, and vertically movable.

Numeral 4 denotes a substrate recognition camera for position recognition of the printed boards P, which is fixed to the mounting head 6 for picking up images of positioning marks provided on the printed boards P. Numeral 12 denotes a component recognition camera, which picks up images of the electronic components for performing position recognition about how much the electronic components as adsorbed/held are misregistered with respect to the adsorption nozzles 7 as to the X and Y directions and rotation angles.

Figure 2:
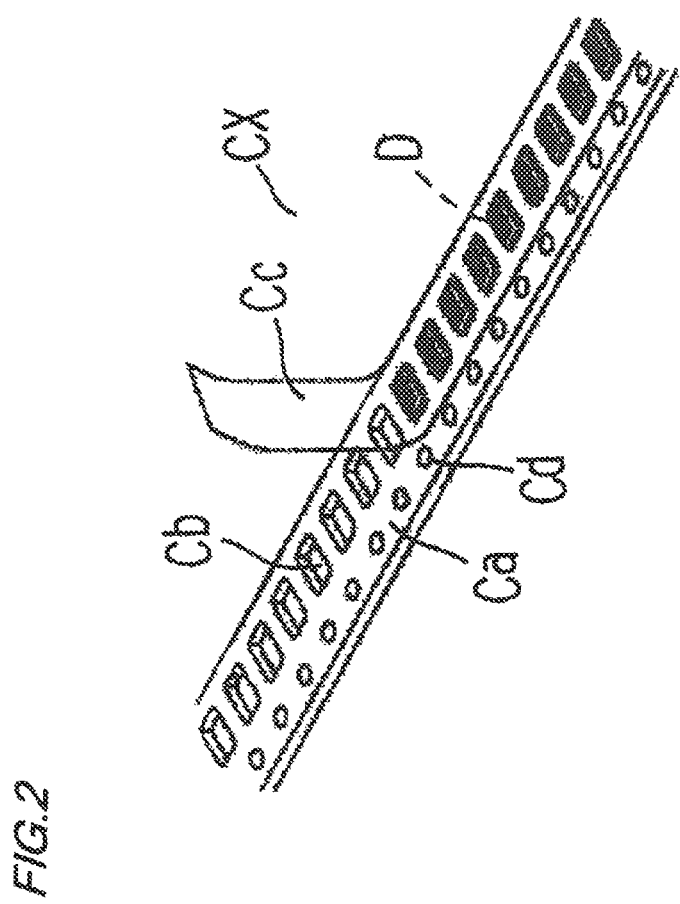
FIG. 2 is a perspective view of a storage tape.

A storage tape CX is described on the basis of FIG. 2 which is a perspective view of the storage tape CX. This storage tape CX stores electronic components D in storage recess portions Cb formed on a carrier tape Ca at prescribed intervals, and a cover tape Cc is bonded onto the carrier tape Ca to cover the storage recess portions Cb. Feeding holes Cd are formed on the carrier tape Ca at prescribed intervals.

Figure 3B:
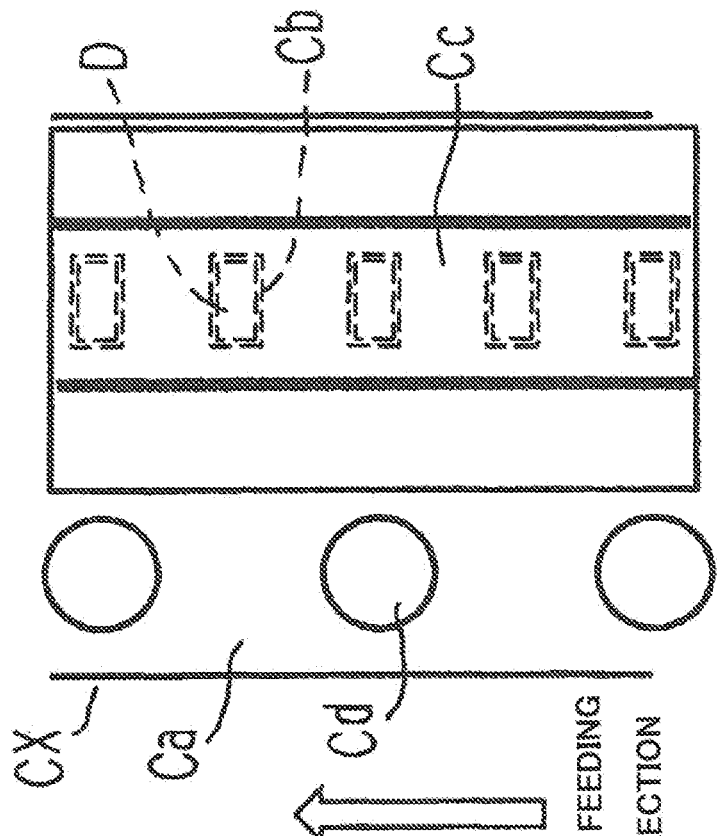
FIG. 3(B) shows a storage tape for small components.
Figure 3A:
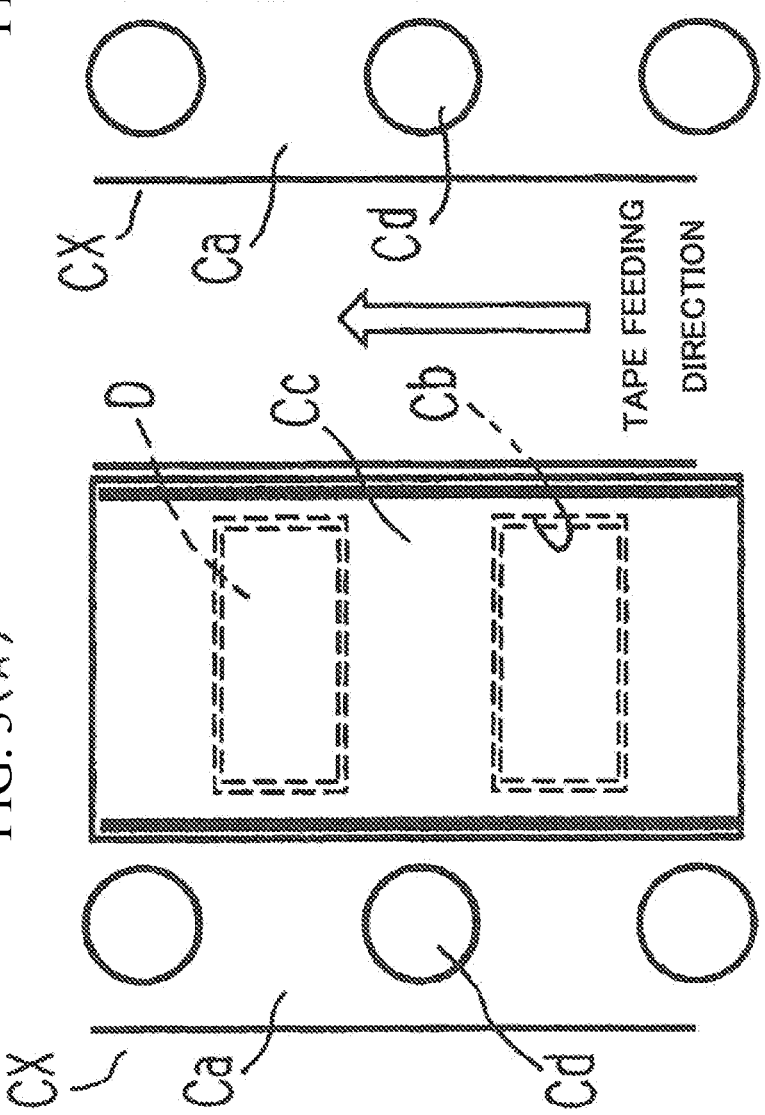
FIG. 3(A) shows a storage tape for large components.

Further, positions of bonding portions Ce (portions bonding (welding)/fixing the cover tape Cc to left and right sides of the storage recess portions Cb) of the cover tape Cc vary with the sizes of the loaded electronic components, as shown in FIG. 3. In other words, storage tapes CX shown in FIG. 3(A) and 3(B) are both those of paper tapes of 8 mm in width, while FIG. 3(A) shows a storage tape CX for large components, in which storage recess portions Cb are also large and hence bonding portions Ce applied along a traveling direction are also positioned on outer sides, and FIG. 3(B) shows a storage tape CX for small components, in which storage recess portions Cb are also small and hence bonding portions Ce are also positioned on inner sides.

The structure of each of the component supply units parallelly arranged on the feeder base is now briefly described with reference to FIG. 4 which is a schematic side elevational view of the component supply unit 5 and FIG. 5 which is a schematic plan view of the component supply unit 5. First, the component supply unit 5 includes a tape introduction mechanism introducing the storage tape CX in a state wound on a rotatably mounted storage tape reel through a guide path.

This tape introduction mechanism is constituted of a DC motor 17 which is a tape introduction driving source and an introduction motor including a gear 18 on an output shaft 16 thereof and a first sprocket 23 including a worm wheel 22 meshing with a worm gear 21 provided on an intermediate portion of a rotating shaft 20 provided with a gear 19 meshing with the gear 18 so that tape feeding teeth formed on an outer peripheral portion thereof mesh with the feeding holes Cb formed on the storage tape CX pressed by a tape pressing member 24 from above for feeding this storage tape CX. Numeral denotes a first detection sensor, which is a sensor detecting the storage tape CX introduced into the component supply unit 5.

Numeral 27 denotes a second sprocket, and this second sprocket 27 includes an operation of supplying the storage tape CX to a tape processing unit 28 described later. Numeral 29 denotes a third sprocket for advancing/moving the storage tape CX to cut open the cover tape Cc of the storage tape CX with a cutter 30 provided on the tape processing unit 28.

The cutter 30 is now described in detail on the basis of FIGS. 16 to 19.

A blade portion 101 is formed on a forward end portion of the cutter 30, and the blade portion 101 is directed from a forward end toward a downstream side assuming that an upstream side of a feeding direction for the storage tape is the forward end, and formed from an intermediate portion of a lower portion of the forward end obliquely upward. Further, the blade portion 101 is formed to gradually thicken from the forward end, and the forward end portion of the blade portion 101 is C-chamfered on upper and lower portions respectively with respect to a shape before working shown by broken lines 112 and 113 in FIG. 23.

Figure 23:
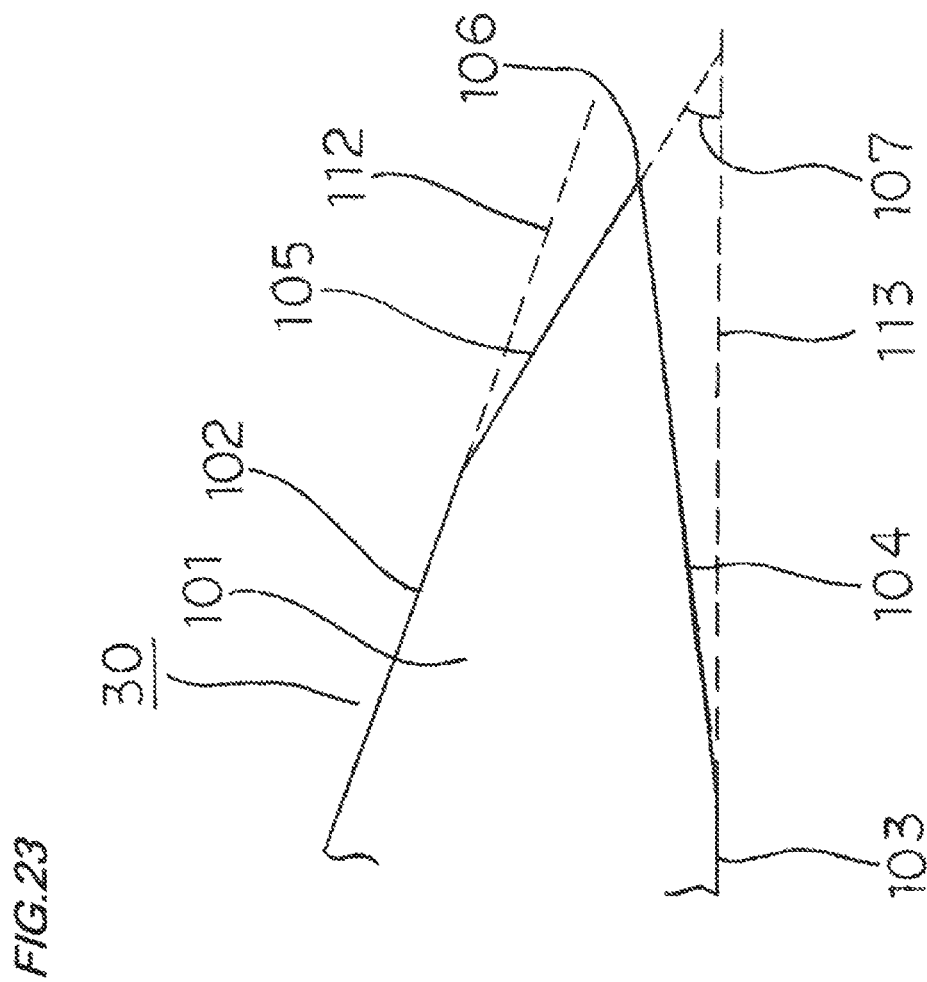
FIG. 23 is a side elevational view of a forward end portion of the cutter.

In other words, a trapezoidal bottom C-chamfered surface (hereinafter referred to as a bottom worked surface) 104 is formed on a bottom surface 103 upward toward the blade forward end, and the bottom worked surface 104 has a shape formed by C-chamfering an extension line 112 of the bottom surface shown by a broken line, as shown in FIG. 23. Further, an isosceles-triangular upper C-chamfered surface (hereinafter referred to as an upper worked surface) 105 which is an example of a flat portion is formed on an upper portion of the forward end portion downward toward the blade forward end. In other words, the upper worked surface 105 illustrated in FIG. 16 etc. is a flat surface, and a side upward beyond the same is an angular blade portion 102 in which a sharp blade is angularly formed. The worked surface 105 presents a shape formed by C-chamfering an extension line 113 of the angular blade portion 102 shown by the broken line as shown in FIG. 23.

On the forward end of the cutter, 106 which is horizontal and small-dimensional is formed in a direction orthogonal to the longitudinal direction (feeding direction for the storage tape) thereof.

The shape of the edge 106 may be the shape of a horizontal sharp blade, or may also be the so-called R shape in which a vertical section in the longitudinal direction of the cutter is rounded, and this R diameter may be small.

Figure 21:
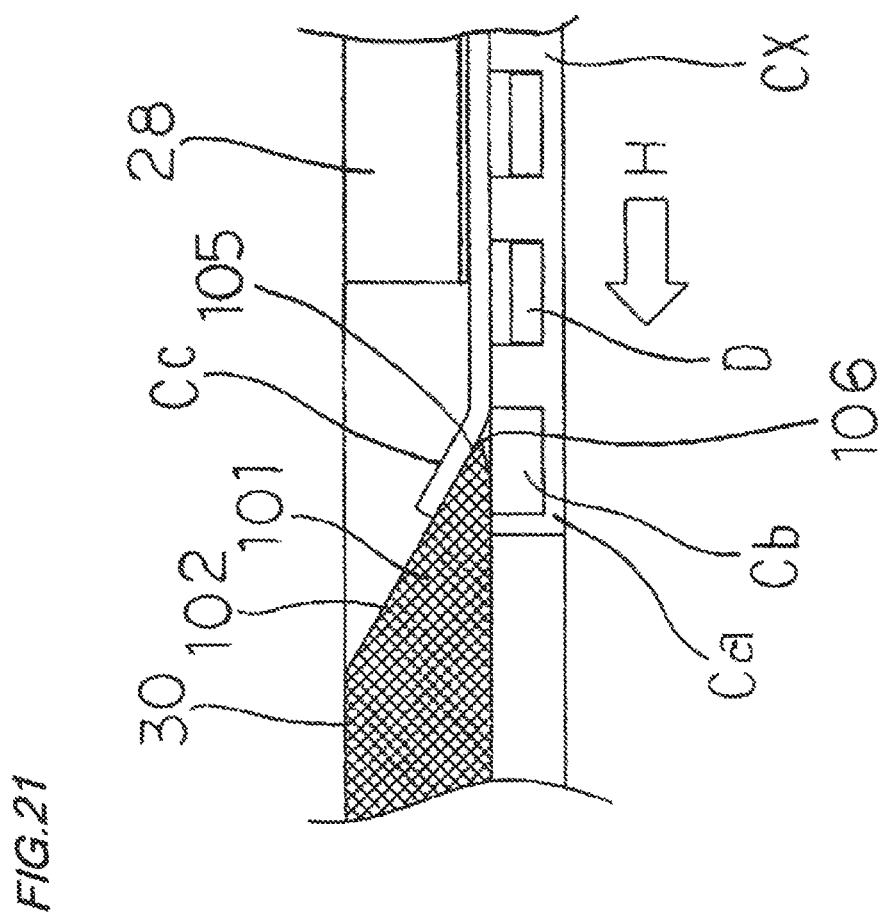
FIG. 21 is a diagram illustrating a state where a cover tape is cut with the cutter.

When an angle 107 between the upper worked surface 105 on the forward end of the cutter 30 and the extension line of the bottom surface 103 shown in FIG. 23 enlarges, the cover tape is not cut but lifted up on the upper worked surface 105, whereby a clearance is formed between the cover tape and the upper worked surface, while the carrier tape is also lifted up together. This clearance enlarges as the angle 107 enlarges. When the clearance enlarges, the carrier tape Ca shown in FIG. 21 is easily lifted up. The edge 106 sticks in the carrier tape Ca to progress from an upper portion to a lower portion of the carrier tape Ca, and there is an apprehension that movement of the storage tape CX is inhibited. Further, the edge 106 is easily chipped when the angle 107 lessens, and hence the angle 107 is preferably set to an angle of about 25°, for example.

When preparing the cutter including the blade portion 101, the blade portion 101 may be formed not by performing C-chamfering on the forward end portion, but by taperingly cutting an upper portion with respect to a cutter presenting the shape of a side surface such as that shown in FIG. 23, for example, and having respective surfaces similar to the bottom worked surface 104 and the upper worked surface 105, to have the same shape as the shape after the C-chamfering.

Numeral 32 denotes a servomotor, and a belt 35 is extended between a pulley provided on an output shaft 33 thereof and a pulley provided on the rotating shaft 34, so that the rotating shaft 34 rotates through the output shaft 33 and the belt 35 when the servomotor 32 normally rotates.

When the rotating shaft 34 intermittently rotates, therefore, it follows that the second sprocket 27 and the third sprocket 29 including worm wheels 39 and 40 meshing with respective worm gears 37 and 38 provided on an intermediate portion of this rotating shaft 34 intermediately rotate respectively. In other words, it follows that the second sprocket 27 and the third sprocket 29 rotate when tape feeding teeth formed on outer peripheral portions of the second sprocket 27 and the third sprocket 29 mesh with the feeding holes Cb formed on the storage tape CX pressed by a suppressor 43 from above and the rotating shaft 34 rotates, to be capable of intermittently feeding the storage tape CX.

Numeral 44 denotes a second detection sensor, which is a sensor detecting the introduced storage tape CX. In order to reliably perform grasping of a forward end position of the storage tape CX in consideration of clearance loss at the time of engagement (transfer resulting from speed difference) of the feeding holes Cd of the storage tape CX with the respective tape feeding teeth of the first sprocket 23 and the second sprocket 27, i.e., the operation of not immediately fitting but eventually engaging with the tape feeding teeth while sliding, the second detection sensor 44 is arranged between the second sprocket 27 and the third sprocket 29, for controlling the device to decelerate and then to stop when performing forward end detection of the storage tape CX.

The interval between the first sprocket 23 and the second sprocket 27 is so large that the engaging operations of the tape feeding teeth of both sprockets 23 and 27 are influenced by accumulated pitch errors of the respective feeding holes Cd of the storage tape CX, and hence the rotational frequency of the first sprocket 23 is set to low-speed rotation slightly smaller than the rotational frequency of the second sprocket 27. In order to reduce deformation of the feeding holes Cd influencing feeding position accuracy of the storage tape CX, further, a rounded tooth form has been employed as the tape feeding tooth shape of the first sprocket 23, to be capable of carrying the tape to the second sprocket 27 and the third sprocket 29 in front thereof while keeping the feeding holes Cd in the initial state without deforming the same.

The second sprocket 27 and the third sprocket 29 have been arranged as close as possible to each other to be set to a span not influenced by the accumulated pitch errors, while the servomotor 32 has been employed as described above to be capable of bearing acceleration/deceleration control, speed control and torque control necessary in a tape processing sequence and set to operations according to the same driving source.

The suppressor 43 and the tape processing unit 28 of a type "W8S", described later, for small components are now described on the basis of FIGS. 7 to 15. A guide chute 50 transporting the storage tape CX is fixed to the component supply unit 5 with fixing bolts 26. The suppressor 43 acts to regularly press the storage tape CX transported while sliding on this guide chute 50 toward this guide chute 50 from above so that the storage tape CX does not vertically move at the time of feeding the storage tape CX and so that the feeding holes Cd of the storage tape CX do not drop and come off the tape feeding teeth of the second sprocket 27 and the third sprocket 29, and the tape processing unit 28 presses the storage tape CX from above due to urging force of the suppressor 43.

The fixation of the guide chute 50 to a unit body 5A with the fixing bolts 26 can be performed by inserting a tool through through-holes 41 set up in the upper surface of the tape processing unit 28 or through-holes 42 set up in the suppresser 43 and the through-holes 41 and screwing head portions of the fixing bolts 26.

The suppresser 43 is now described in detail. A section of this suppresser 43 presents a substantially U shape, while mounting openings 52 are formed in an upper surface 43A thereof, so that downstream-side portions (hereinafter referred to as downstream portions) 28A which are parts of the tape processing unit 28 and mounted with the cutter 30 are mounted into these mounting openings 52 in a state fitting therein from below.

Figure 7:
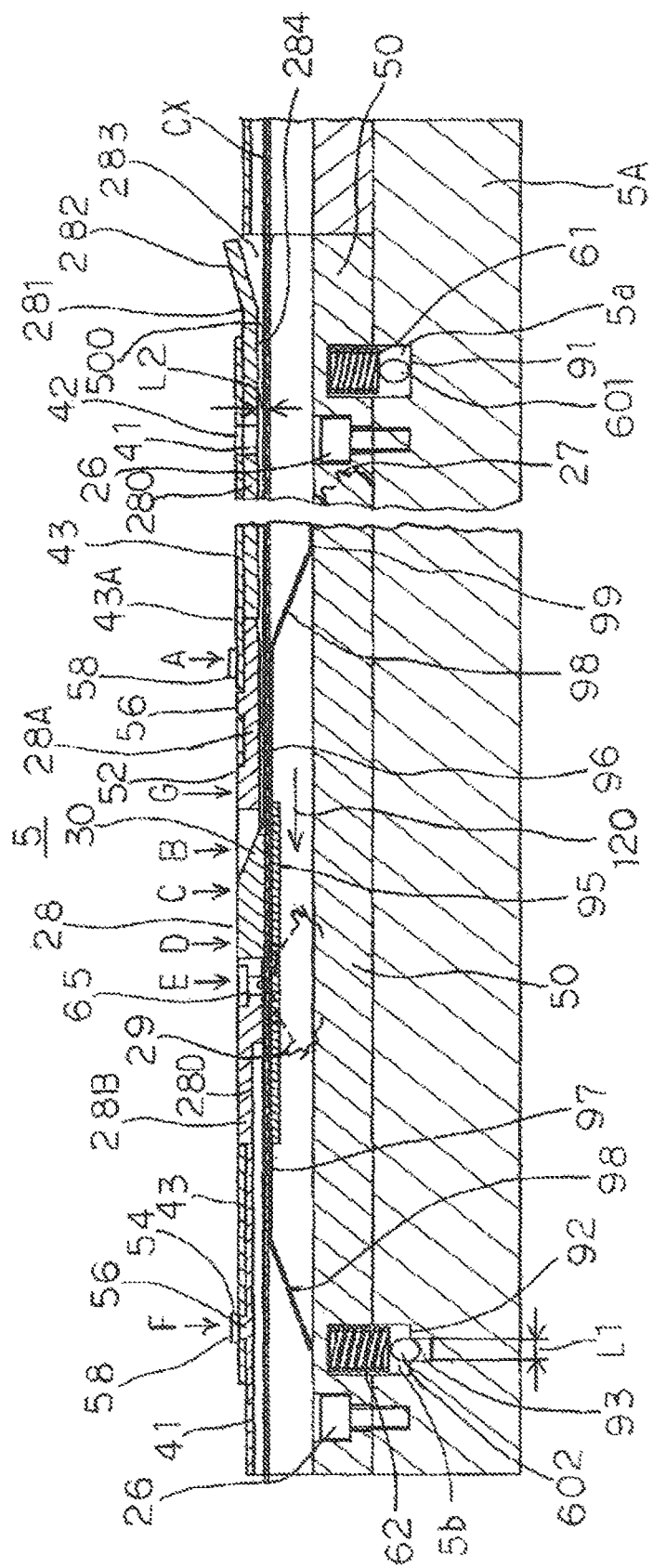
FIG. 7 is a sectional view taken along the line 7-7 of the component supply unit including the tape processing unit of the type "W8S" of FIG. 6.
Figure 8:
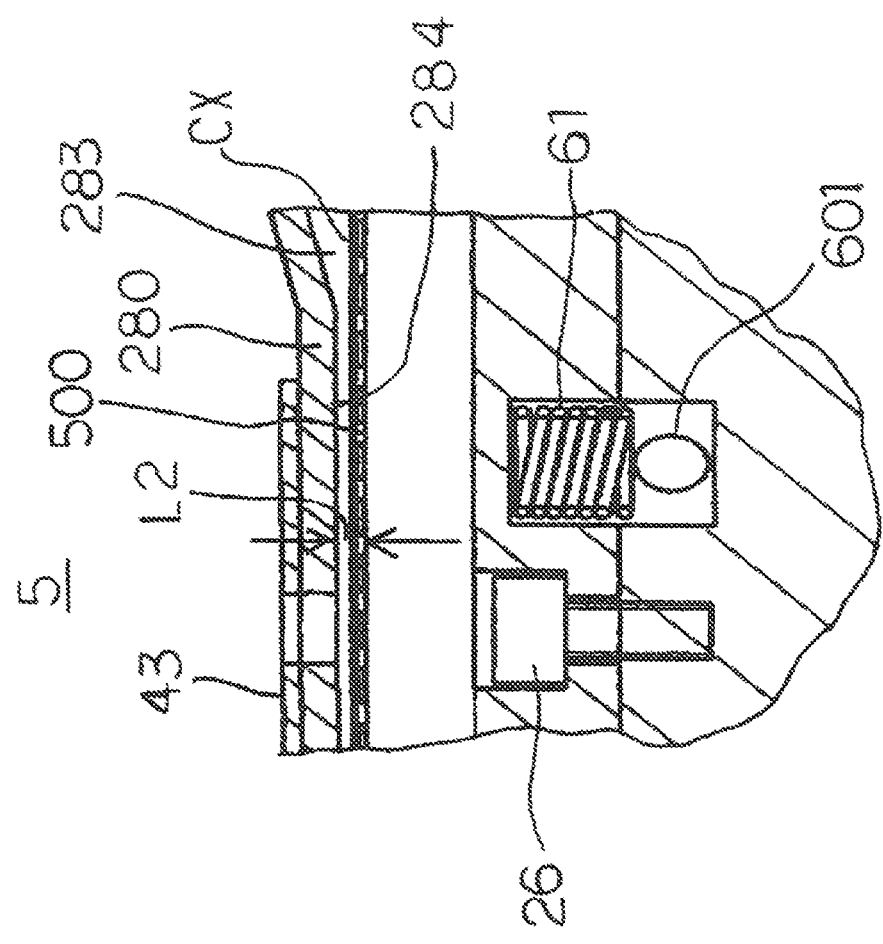
FIG. 8 is a diagram enlarging the vicinity of a tape inlet of FIG. 7.
Figure 9:
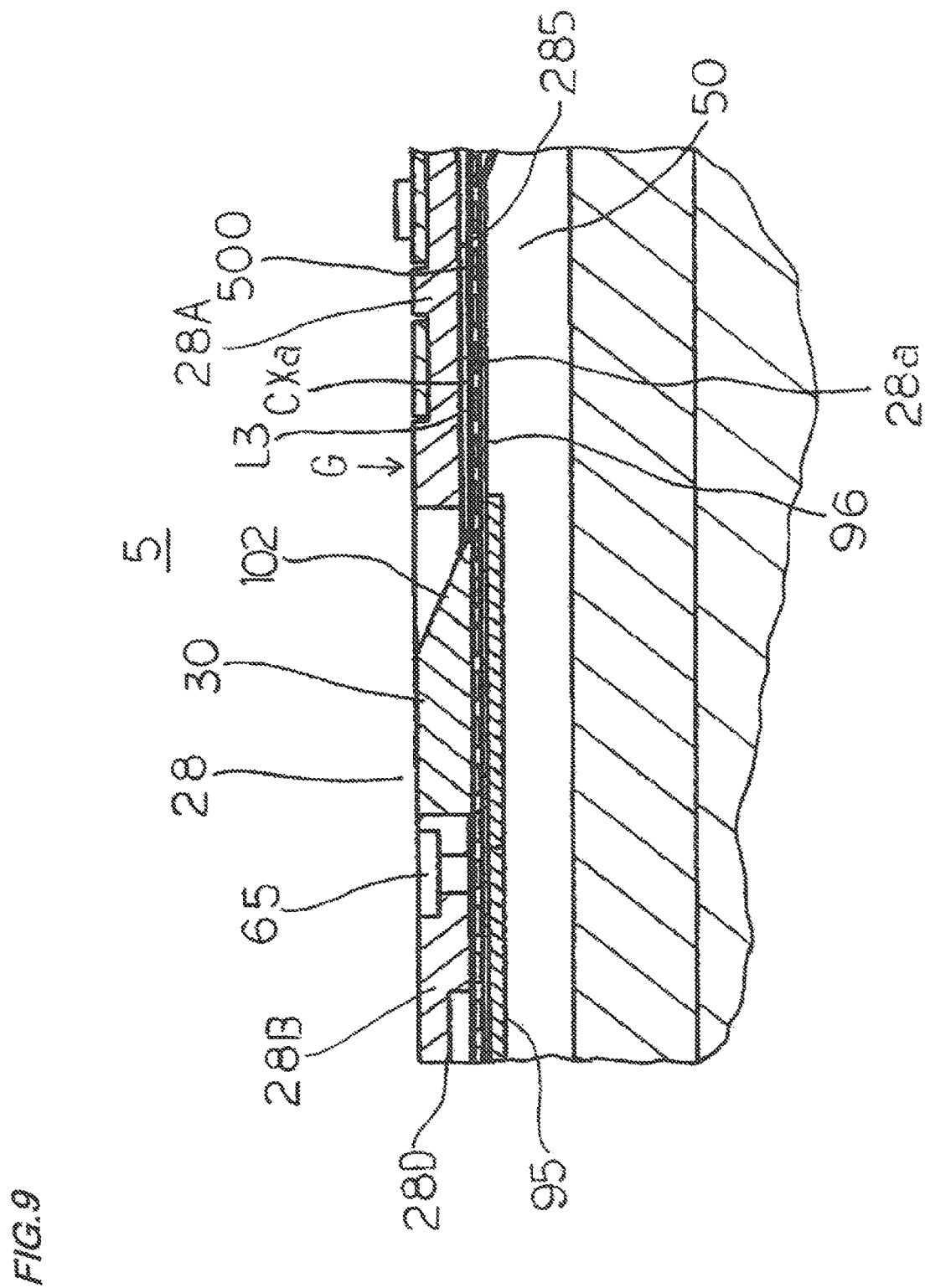
FIG. 9 is a diagram enlarging an arrangement portion of a cutter in FIG. 7.
Figure 10:
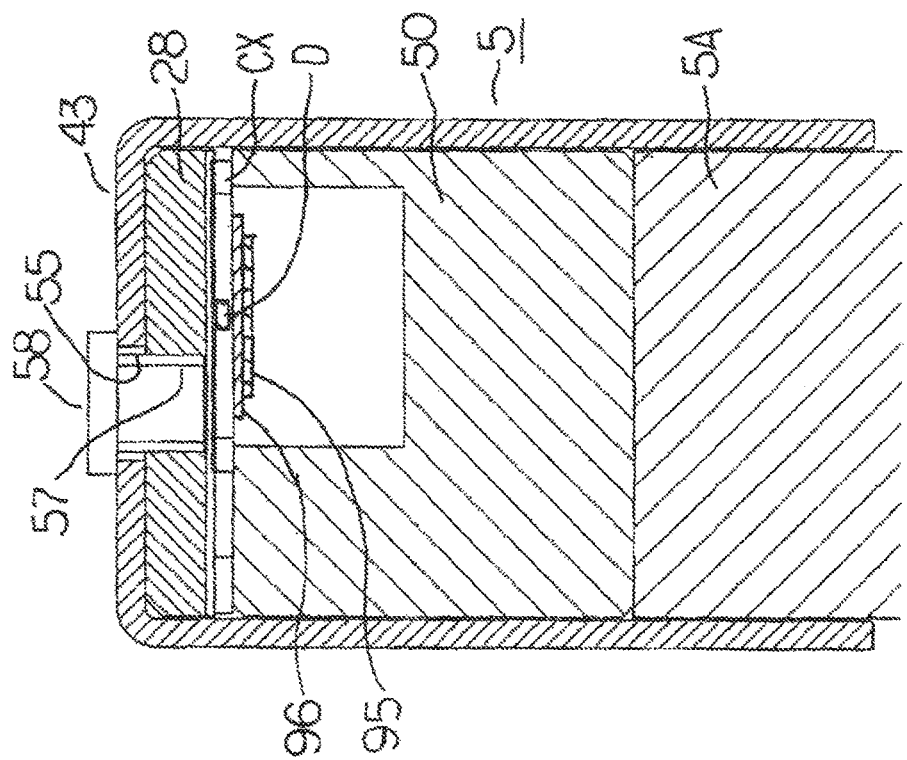
FIG. 10 is a diagram vertically sectioned from an A position in FIG. 7.
Figure 15:
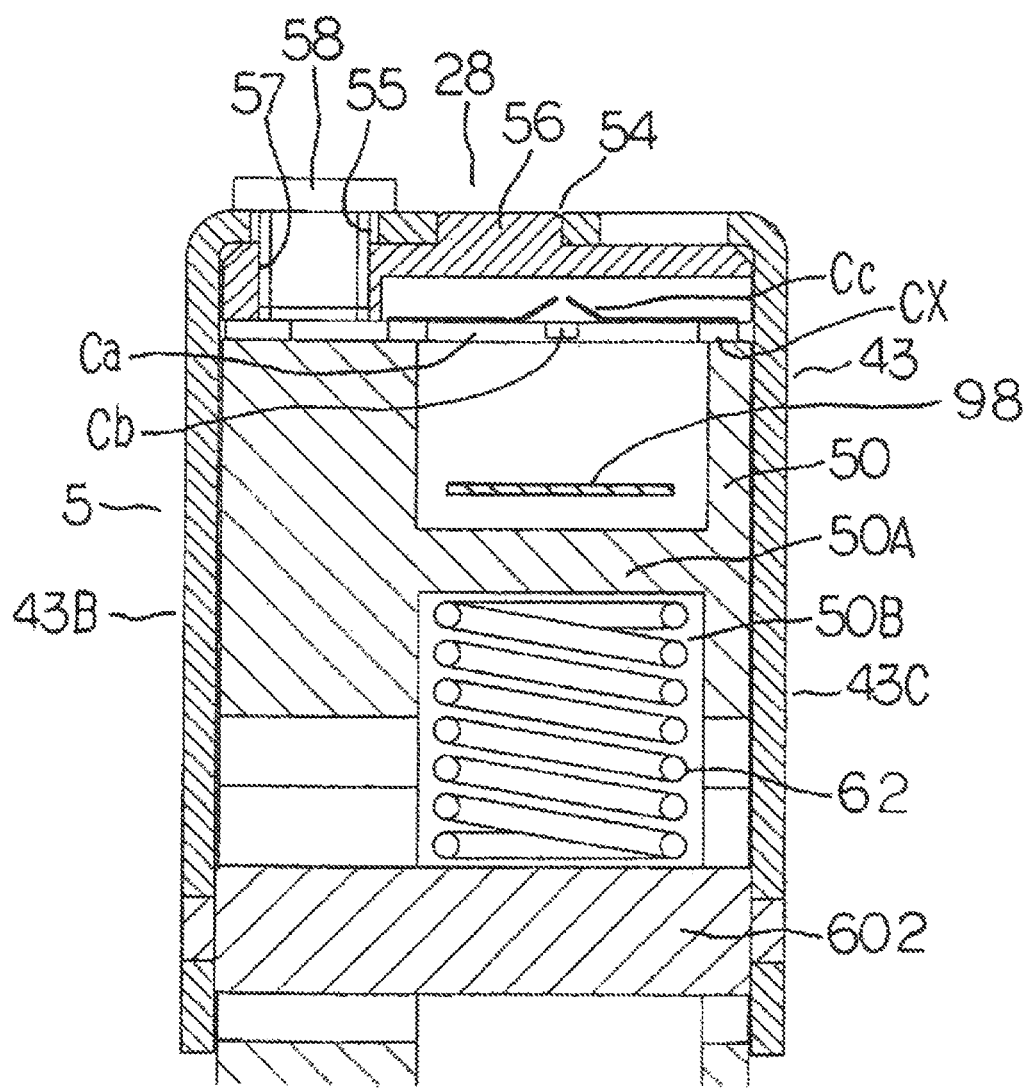
FIG. 15 is a diagram vertically sectioned from an F position in FIG. 7.
Figure 16:
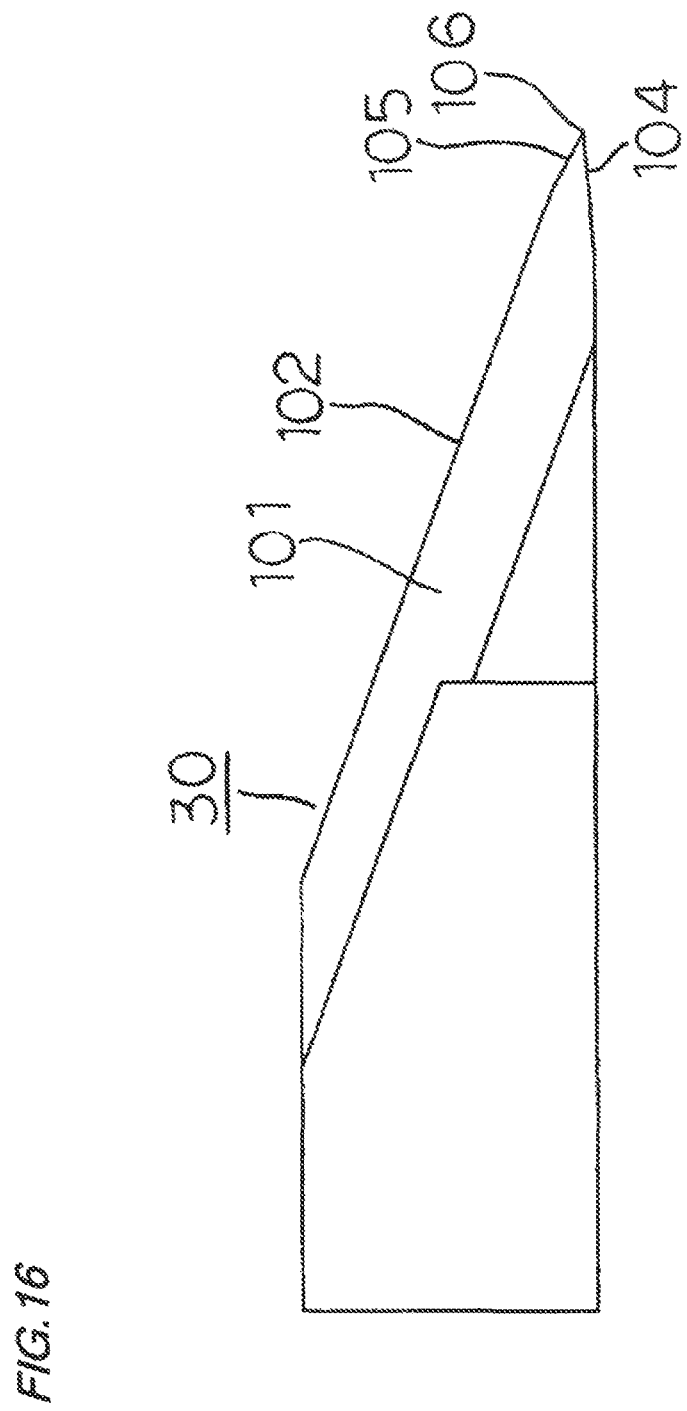
FIG. 16 is a side elevational view of the cutter.
Figure 17:
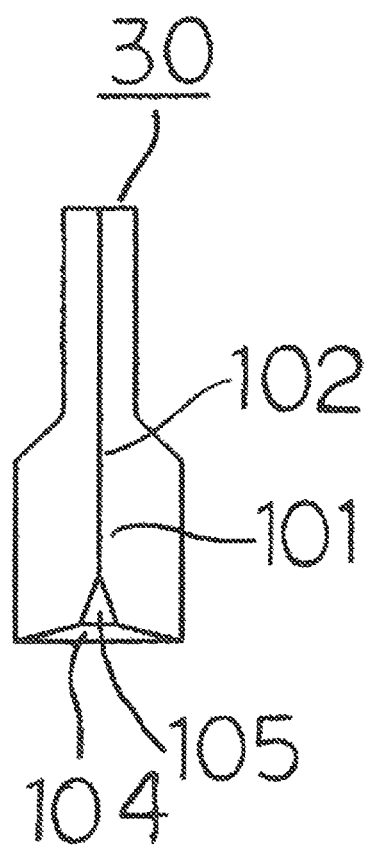
FIG. 17 is a front elevational view of the cutter.

In this case, positioning openings 54 and mounting holes 55 are set up in pairs in the upper surface 43A of the suppresser 43 avoiding the mounting openings 52, and respective screw holes 57 set up in the vicinity of positioning projecting portions 56 and the respective mounting holes 55 are matched with each other and respective fixing screws 58 mesh into the respective screw holes 57 in a state passing through the respective mounting holes 55 in a state of engaging the respective positioning projecting portions 56 formed on the upper surface of the tape processing unit 28 into the respective positioning openings 54 on the upper surface of the suppressor 43, so that the tape processing unit 28 is attachably/detachably mounted under the upper surface of the suppressor 43 (see FIGS. 7, 9 and 15).

A tape inlet side portion 43A of the suppressor 43 includes a platelike guide section 80, a bent portion 281 bent upward is formed on a tape inlet side of the guide section 280, and a bent section 282 extending from this bent portion 281 obliquely upward toward the forward end for guiding the storage tape CX is formed. An inlet 283 for the storage tape is formed under this bent section 282.

Between both side surfaces 43B and 43C of the suppressor 43, a support pin 601 and a support pin 602 having circular sections are provided on a tape inlet side (right-side portion in FIG. 7) and a tape outlet side (left-side portion in FIG. 7) of the suppressor 43 to couple the side surfaces 43B and 43C with each other. Springs 61 and 62 are arranged between these support pins 601 and 602 and storage recess portions 50B formed upward in a horizontal surface 50A which is the lower surface of the guide chute 50. Due to downward urging force of these springs 61 and 62, the suppressor 43 is urged downward, to regularly press the storage tape CX on the guide chute 50 onto this guide chute 50 through the tape processing unit 28 provided on the downstream side of the guide section 280, so that the feeding holes Cd of the storage tape CX do not come off the tape feeding teeth of the second sprocket 27 and the third sprocket 29.

The respective pins 601 and 602 on the inlet side and the outlet side are arranged in a recess portion 5a on the inlet side and a recess portion 5b on the outlet side formed downward from the upper surface of the unit body 5A respectively. A bottom 91 of the recess portion 5a on the inlet side is formed as a flat surface, and the support pin 601 on the inlet side is supported on this bottom 91. A recess portion 93 is further formed on a bottom 92 of the recess portion 5b on the outlet side. A dimension of this recess portion 93 in the horizontal direction (feeding direction for the storage tape) in FIG. 7, i.e., a dimension L1 in a direction orthogonal to the direction in which the support pin 602 is extended is formed to be slightly smaller than the dimension of the diameter of the support pin 602. Consequently, a lower portion of the support pin 602 on the outlet side enters the recess portion 93 and is on a position (height) lower than the support pin 601 on the inlet side, while the suppressor 43 is supported obliquely downward from the inlet side toward the outlet side (from the upstream side toward the downstream side) (from the right side toward the left side in FIG. 7). The tape processing unit 28 is so horizontally mounted with respect to the suppressor 43 that the height of the tape processing unit 28 on the inlet side is larger than that on the outlet side due to the inclination of the suppressor 43, the tape processing unit 28 is supported by the suppressor 43 to obliquely lower from the inlet side toward the outlet side (from the right side toward the left side in FIG. 7), and the lower surface is inclined downward from the inlet side toward the outlet side.

Therefore, a lower surface 284 of a portion of the guide section 280 downstream beyond the bent portion 281 and a lower surface 285 of the tape processing unit 28 are inclined downward from the upstream side toward the downstream side. Consequently, the vertical interval L2 between the lower surface 284 of the portion of the guide section 280 downstream beyond the bent portion 281 and the lower surface of the tape processing unit 28 and a tape support surface 500 which is the upper surface of the chute 50 through which the storage tape CX is fed and on which the storage tape CX is placed and supported is larger than the thickness of the storage tape CX, and the interval L2 gradually lessens from the upstream side toward the downstream side due to the inclination of the tape processing unit 28. Further, the interval L2 is equal to the thickness of the storage tape CX or slightly smaller than the thickness on the upstream side of the storage tape CX on a position slightly upstream beyond the cutter 30, and the storage tape CX is pressed by the tape processing unit 28 from above until a head end surface 111 thereof advances toward a portion downstream beyond the position of the edge 106 of the cutter 30 and the cutter 30 enters a state running onto the carrier tape Ca on a side downstream beyond its position.

Further, a magnet 95 is provided under the cutter 30 and a component outlet port 65. Numeral 96 denotes a support member for the magnet 95, and this support member is formed by bending a conductive member such as a copper plate, for example, and has elasticity. The support member 96 includes a central magnet mounting portion 97, support legs 98 extending obliquely downward from front and rear portions of the mounting portion 97 and a fixing portion 99 horizontally extending from the lower end of the support leg 98 on the upstream side to be fixed to the chute 50 with a screw, and the magnet 96 is stuck to the lower surface of the mounting portion 98 with an adhesive, for example.

Each storage recess portion Cb of the storage tape CX positioned substantially at the center of the chute 50 is supported by the support member 96, urged upward due to the elasticity of the support member 96, and pressed by the lower surface of the tape processing unit 28 or the lower surface of the cutter 30 from above at least on a position reaching a lower portion of the cutter 30 from a position slightly upstream beyond the cutter 30, for example. Movement of the electronic components in the component outlet opening 65 and on a position upstream beyond this position can be suppressed.

When canceling the engagement of the fixing screws 58 in the screw holes 57, and extracting the fixing screws 58 from the mounting holes 55, the suppressor 43 is pressed upward against the urging force of the springs 61. It follows that the projecting portions on the upper surface of the tape processing unit 28 come off the mounting openings 52, so that the tape processing unit 28 can be detached while being drawn out from a front portion of the suppressor 43.

Figure 6:
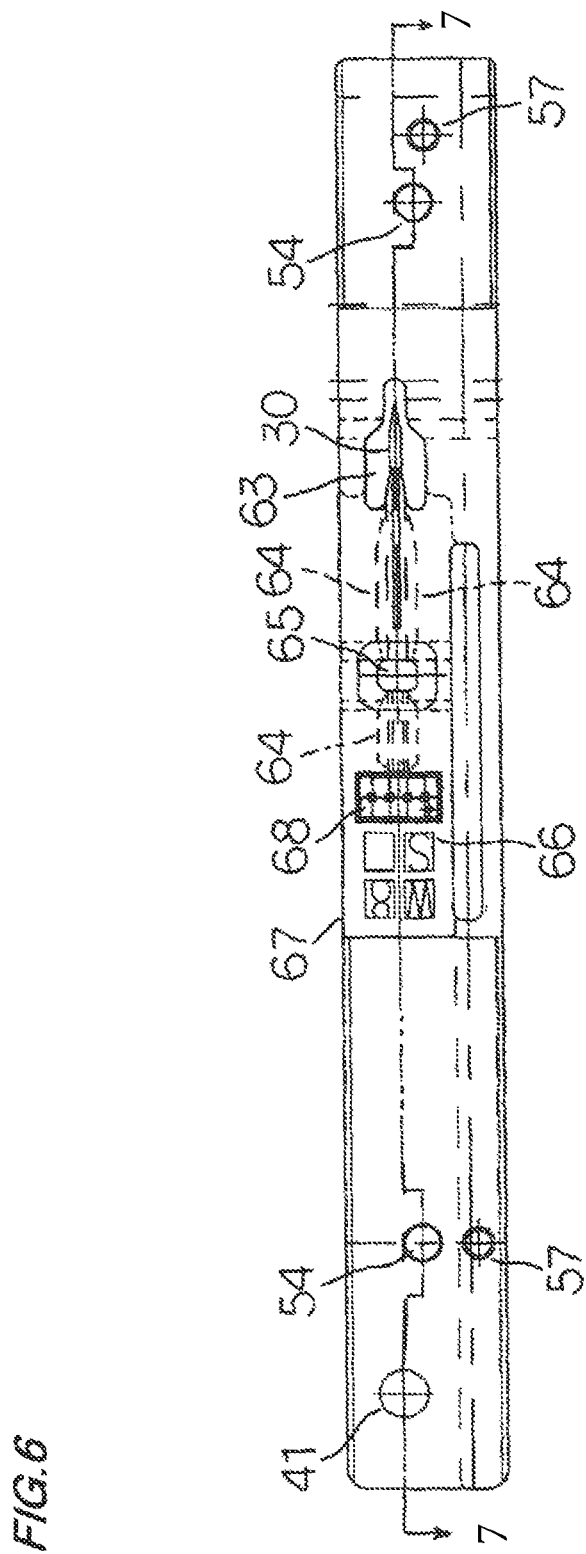
FIG. 6 is a plan view of a tape processing unit of a type "W8S".
Figure 11:
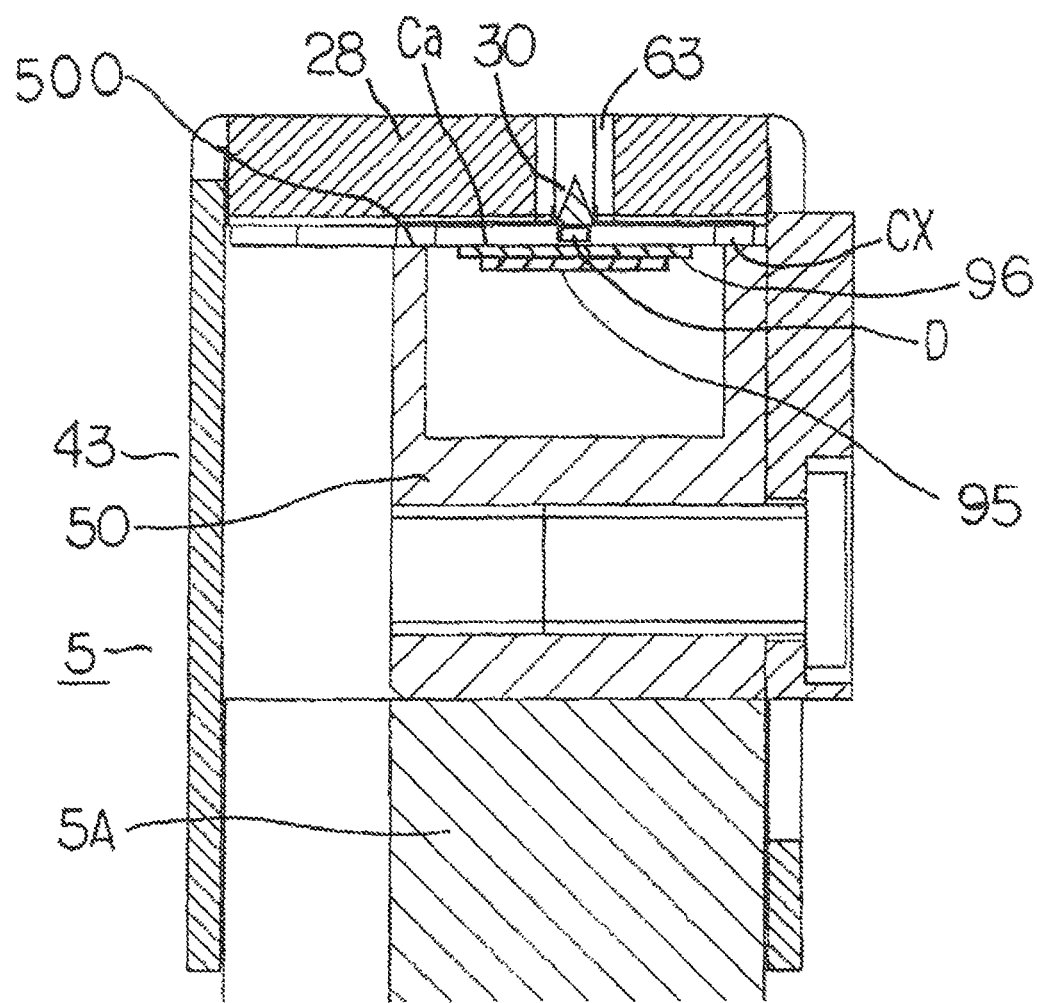
FIG. 11 is a diagram vertically sectioned from a B position in FIG. 7.
Figure 12:
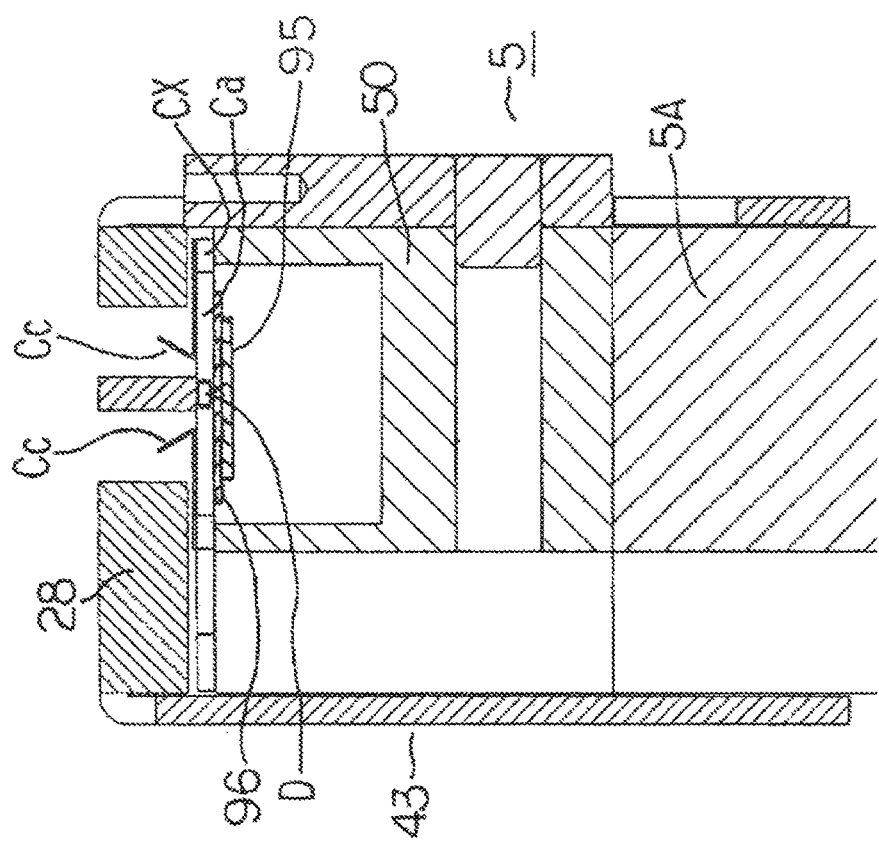
FIG. 12 is a diagram vertically sectioned from a C position in FIG. 7.
Figure 13:
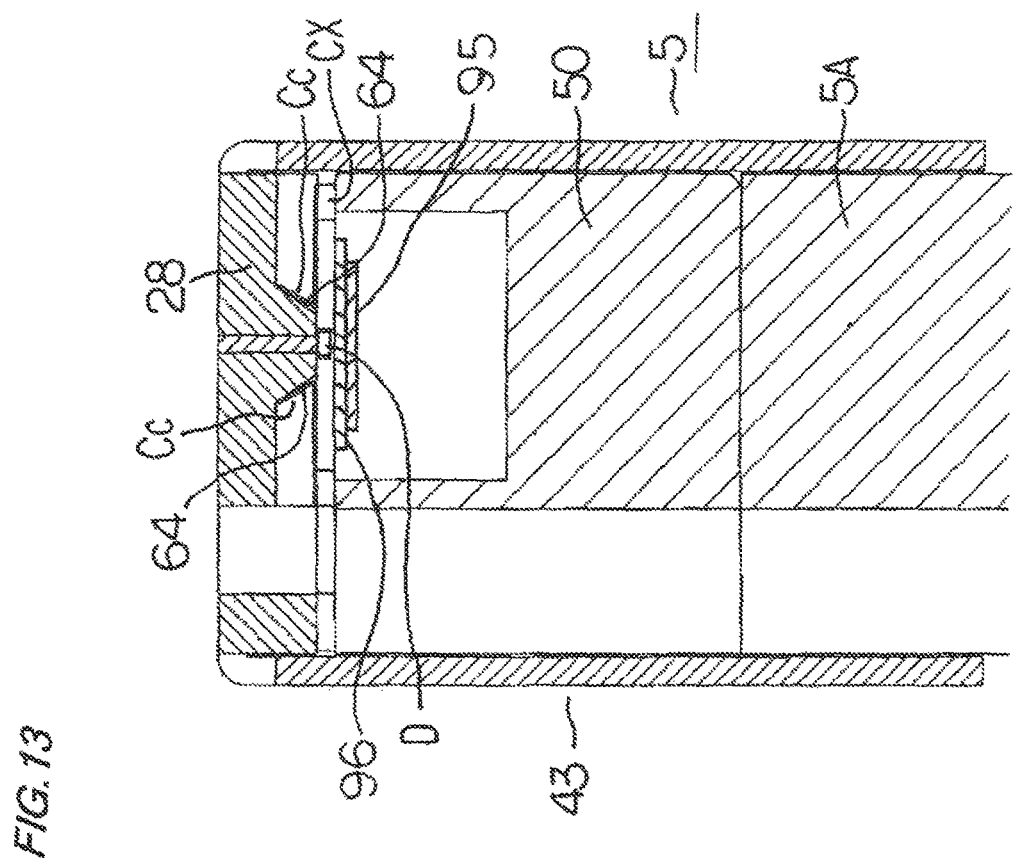
FIG. 13 is a diagram vertically sectioned from a D position in FIG. 7.

An opening 63 is set up in the tape processing unit 28, so that the cutter 30 successively cutting open the cover tape Cc of the supplied storage tape CX along the traveling direction following traveling thereof can be observed through the opening 63 (see FIGS. 6 and 11). While the cover tape Cc is successively cut open following the traveling of this storage tape CX (FIGS. 11 and 12), guide surfaces 64 guide to push upward and open the cover tape Cc so that an opening end portion thereof comes to a maximum height portion after the same is cut open on left and right sides in the traveling direction respectively (see FIG. 13).

Further, the component outlet opening 65 having a larger plane surface area than the electronic components D is set up in a downstream portion 28B of the tape processing unit 28 downstream beyond the cutter 30 (see FIGS. 6 and 14), so that the adsorption nozzles 7 can adsorb and extract the electronic components D in the storage recess portions Cb through the component outlet opening 65 on the component adsorption/extraction position PU opened wider than the width of the electronic components D stored in the storage recess portions Cb along the guide surfaces 64.

Figure 14:
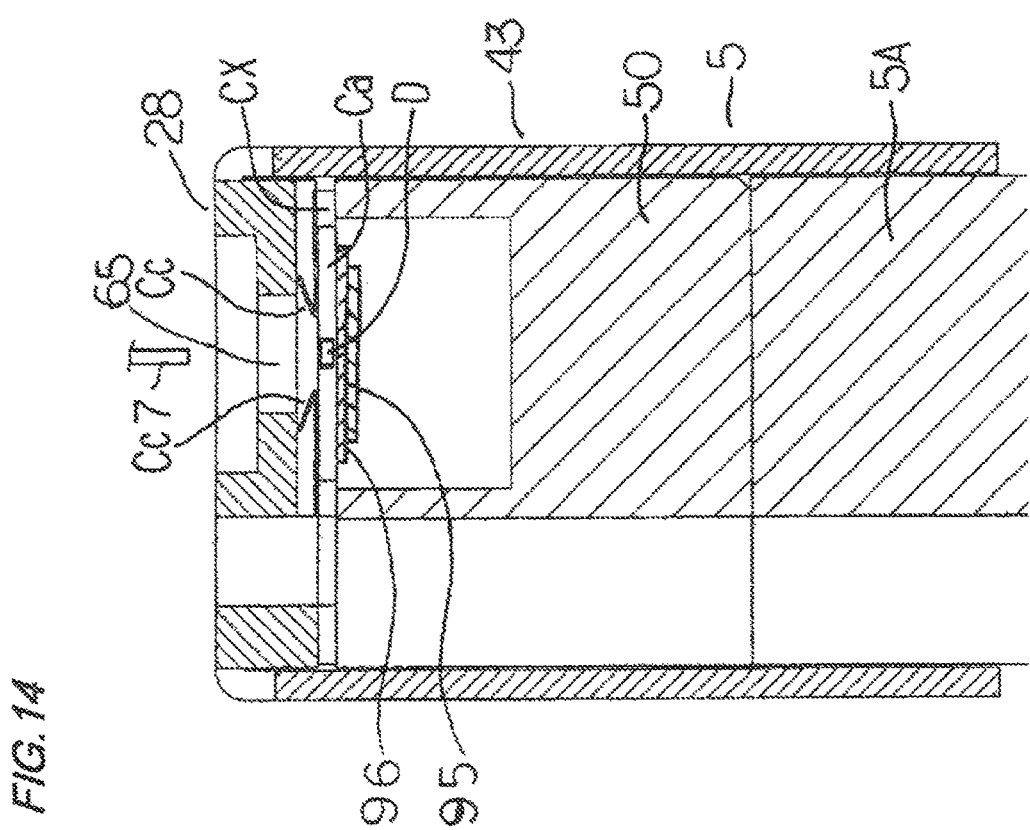
FIG. 14 is a diagram vertically sectioned from an E position in FIG. 7.

However, while each of the guide surfaces 64 cannot be formed on a region where this component outlet opening 65 is formed, the guide surfaces 64 are formed again on the left and right sides in a portion ahead of the component outlet port 65 on the downstream side (see FIG. 6), and these guide surfaces 64 are eventually not formed (see FIG. 14).

An information identification portion 66 for type determination is provided on the downstream portion 28B of the tape processing unit 28, and this information identification portion 66 is constituted of an information identification portion 67 for operator identification of the electronic component mounting device 1 and an information identification portion 68 of the electronic component mounting device 1. The type, such as "W8S", for example, or the like is stamped on the information identification portion 67 for the operator identification, so that the operator can identify the type of the tape processing unit 28 by visual recognition. Further, the type is assigned to the information identification portion 68 of the electronic component mounting device 1 in binarized information (bits) employing four dots, i.e., so that the classification (type) of the tape processing unit 28 in which printings of black dots are 0 to 15 can be identified.

While the information identification portion 68 has the binarized information (bits) employing the four dots as described above, thus allowing direct character recognition or bar code information (one-dimensional or two-dimensional), or a recording medium such as a memory tag or a μ-chip may be embedded. In a case of using such a medium, individual management can also be enabled by also adding a unique management code to the information, in addition to the type information of the tape processing unit 28.

The range of the object electronic components is "0402 to 0603", with the dimensions of these electronic components in the X direction being 0.40 to 0.60 mm and the dimensions in the Y direction being 0.20 to 0.30 mm in the type "W8S", for example, of the tape processing unit 28. The range of object electronic components is "1005 to 1608", with the dimensions of these electronic components in the X direction being 0.61 to 1.60 mm and the dimensions in the Y direction being 0.31 to 3.40 mm in a type "W8M". The range of object electronic components is "1608 to 2012" with the dimensions of these electronic components in the X direction being 1.61 to 2.10 mm and the dimensions in the Y direction being 0.31 to 3.40 mm in a type "W8L". The range of object electronic components is "2012 to 3225", with the dimensions of these electronic components in the X direction being 2.11 to 4.30 mm and the dimensions in the Y direction being 0.31 to 3.40 mm in a type "W8LL". In other words, the type "W8S", for example, can handle electronic components in which the dimensions of the electronic components in the X direction are in the range of 0.40 to 0.60 mm and the dimensions in the Y direction are in the range of 0.20 to 0.30 mm.

Figure 4:
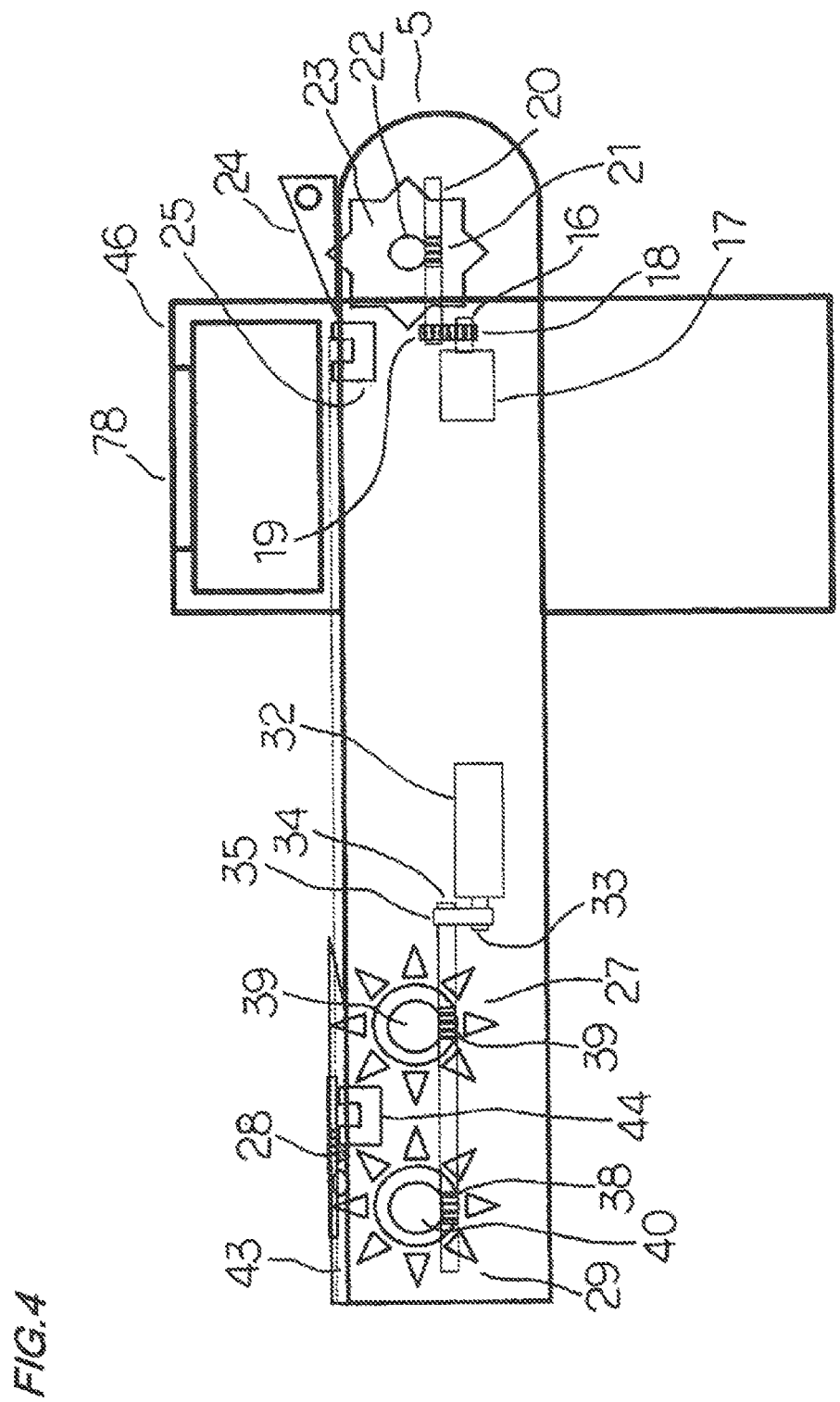
FIG. 4 is a schematic side elevational view of a component supply unit.
Figure 5:
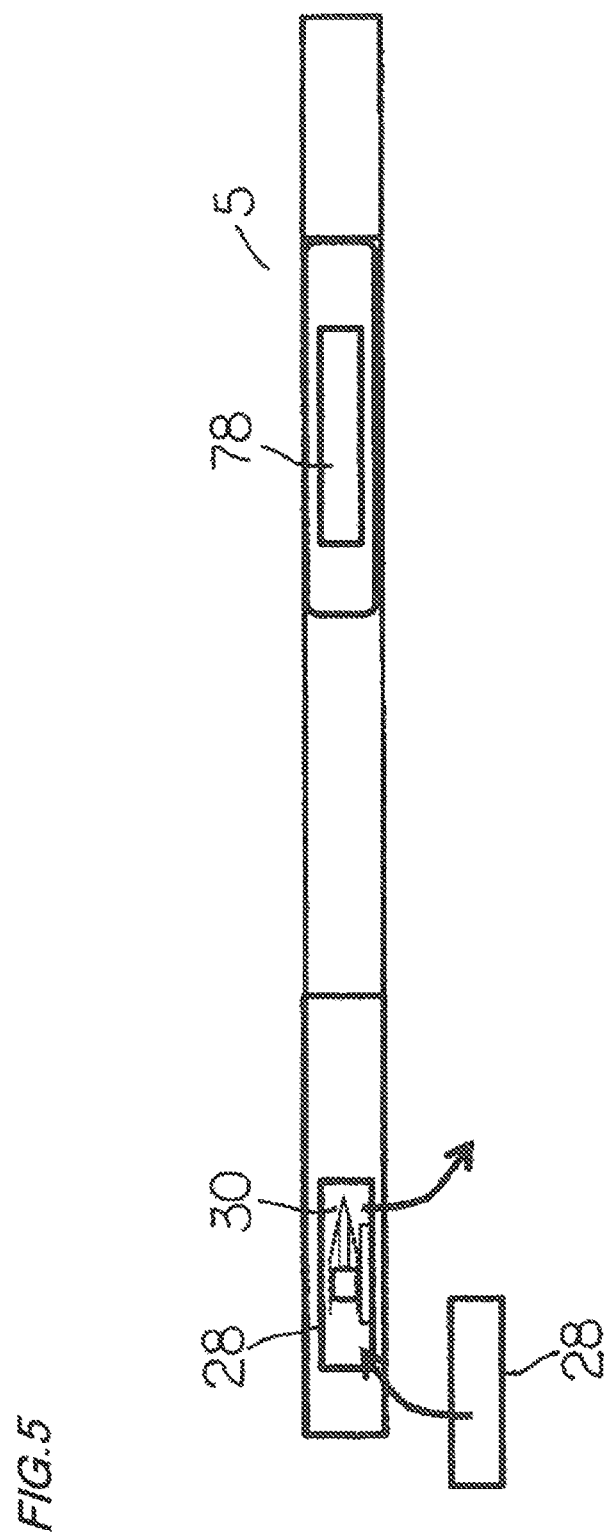
FIG. 5 is schematic plan view of the component supply unit.
Figure 24:
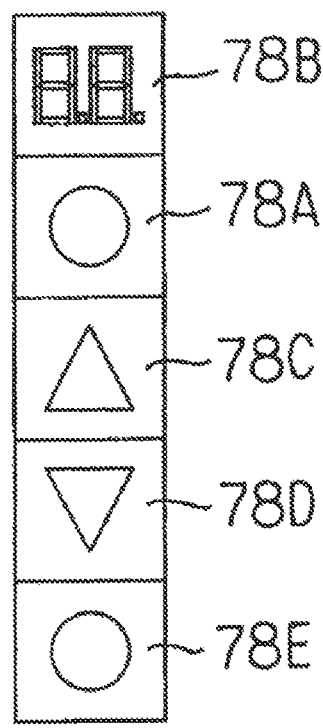
FIG. 24 is a diagram showing an operation panel.

As shown in FIGS. 4 and 5, an operation panel 78 is provided on an upper surface of a handle 46 of the component supply unit 5, and this operation panel 78 is provided with a lane number selection button 78A for selecting the arrangement number (lane number) of the component supply unit 5. A display portion 78B displays the lane number while increasing the same one by one every left portion pressing of this lane number selection button 78A while displaying the lane number while reducing the same one by one every right portion pressing a feeding button 78C, a return button 78D and a loading button 78E (see FIG. 24).

At a time of detaching the component supply unit 5 from the aforementioned feeder base or mounting the former on the latter, therefore, the operator can select (change) the arrangement number (lane number) of the component supply unit on the basis of a pressing operation of the lane number selection button 78A while observing the display portion 78B.

An operation of loading the storage tape CX on the component supply unit 5 is now described. First, the operator sets the tape pressing member 24 after detaching the tape pressing member 24, placing the forward end portion of the storage tape CX on the guide path and engaging the tape feeding teeth of the first sprocket 23 with the feeding holes Cd of the storage tape CX.

When the operator performs a pressing operation of the loading button 78E of the operation panel 78, the control unit 79 controls the device to drive the DC motor 17 by a prescribed time with a timer 45 if the first detection sensor 25 and the second detection sensor 44 have not detected the storage tape CX, and the storage tape CX is successively moved to a downstream portion (inner portion) in the component supply unit 5 due to rotation of the first sprocket 23.

Following this movement, the control unit 79 stops the driving of the DC motor 17 when counting the prescribed time with the timer 45, and starts driving of the DC motor 17 and the servomotor 32 when the first detection sensor 25 detects the forward end of the storage tape CX.

First, the storage tape CX whose forward end portion reaches the first detection sensor 25 to be detected gradually moves to be pushed toward the downstream side due to the rotation of the first sprocket 23 resulting from driving by the DC motor 17, and reaches the inlet 283 of the tape processing unit 28. The bent section 282 is formed on the tape processing unit 28 in the inlet 283. The storage tape CX reaching the inlet 283 is guided by the bent section 282 even if the same is directed obliquely upward, smoothly entering a lower portion of the bent section 282 and moving toward the downstream side. At this time, the tape processing unit 28 is inclined downward from the upstream side (inlet) toward the downstream side, and the storage tape CX smoothly moves toward the downstream side in a space downward beyond the tape processing unit 28, since the vertical interval L2 between the lower surface 284 of the portion downstream beyond the bent portion 281 and the tape support surface 500 which is the upper surface of the chute 50 through which the storage tape CX is fed and on which the storage tape CX is placed and supported is larger than the height of the storage tape CX.

The tape processing unit 28 is inclined downward toward the downstream side as described above, whereby a clearance (interval) between an upper surface CXa of the forward end portion of the storage tape CX and a lower surface 28a of the tape processing unit 28 gradually lessens following the downward movement of the storage tape CX, and the interval L2 substantially equals to the thickness of the storage tape CX on a position G (position slightly (by several millimeters) upstream (closer to the inlet 283) beyond the forward end of the cutter 30, for example) of an upstream portion 28A shown in FIG. 7 between the position of the guide section 280 and the position of the cutter 30 shown in FIG. 7, for example. On a position of the cutter 30 downstream beyond the position G, the vertical interval L2 between the lower surface of the cutter 30 and the tape support surface 500 of the chute 50 lessens little by little.

Consequently, the storage tape CX entering from the inlet 283, moving toward the downstream side and passing through the bent portion 281 to be pressed from the upstream side due to the rotation of the first sprocket 23 can smoothly move toward the downstream side under the tape processing unit 28 as shown by arrow 120 in FIG. 7. Also after the forward end of the storage tape CX reaches the aforementioned position G, the vertical interval L2 between the lower surface of the cutter 30 and the tape support surface 500 of the chute 50 lessens little by little while friction between the storage tape CX, the lower surface of the tape processing unit 28 and the support surface 500 gradually enlarges and can be avoided from abrupt enlargement. The storage tape CX is pressed from the upstream side and can further smoothly move toward the downstream side. Consequently, the storage tape CX can avoid deforming due to resistance at the time of the movement and becoming unmovable before reaching the cutter 30, even in a case where the storage tape CX is a thin storage tape.

Then, the storage tape CX is moved in the front side which is the downstream side by the first sprocket 23, the second sprocket 27 and the third sprocket 28.

The control unit 79 continues the moving operation according to a previously set feed rate, stops the driving of the DC motor 17 when the second detection sensor 44 detects the forward end of the storage tape CX during this movement, and stops the servomotor 32 while forcibly decelerating the same. When the second detection sensor 44 cannot detect the forward end of the storage tape CX in this case although the aforementioned previously set feed rate has been performed, the control unit 79 controls the DC motor 17 and the servomotor 32 to abnormally stop the same.

Then, the control unit 79 repeats a reversal operation by minimum pitch feeding until the second detection sensor 44 does not detect the forward end of the storage tape CX in consideration of the quantity of overrun of the storage tape CX at the time from the aforementioned deceleration up to the stoppage by the servomotor 32, to define the forward end position of the storage tape CX. In other words, the storage unit 79 repeats the reversal operation of the servomotor 32 at the minimum pitch and a stop operation thereby defines the forward end position of the storage tape CX.

While the first sprocket 23 includes a one-way clutch and does not reverse, the storage tape CX engaging with the feeding teeth of the second sprocket 27 is slid out rearwardly due to thrust of the servomotor 32 since the quantity of returning is small and the tooth height of the first sprocket 23 is low.

Then, the control unit 79 controls the driving of the servomotor 32 to deliver the forward end portion of the storage tape CX to a position immediately in front of a blade of the cutter 30 at a high speed in a single feeding operation of a prescribed quantity. In other words, the control unit 79 delivers the storage tape CX up to the position immediately in front of the blade of the cutter 30 at high speed according to design dimensions, due to the definition of the forward end position of the storage tape CX.

Then, the forward end of the storage tape CX moves to a zone for cut-opening the cover tape Cc with the cutter 30, so that the cutter 30 performs cutting/division of the cover tape Cc. Operations at this time are described on the basis of FIGS. 20 to 22.

Figure 20:
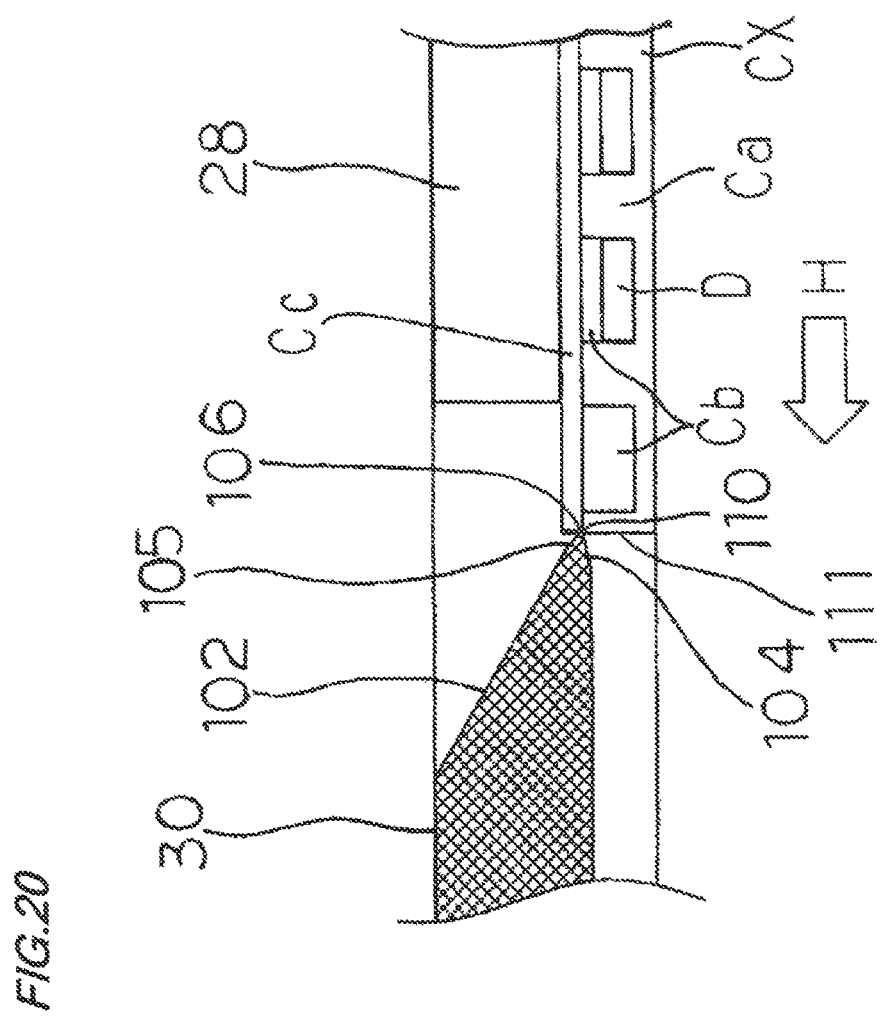
FIG. 20 is a diagram illustrating a time when an edge of the cutter hits an end surface of the storage tape.

When the storage tape CX is fed in an arrow direction H, a blade forward end (frontmost end portion) of the cutter 30 collides with the head end surface 111 of the storage tape CX, as shown in FIG. 20.

FIG. 20 shows the state where the edge 106 on the blade forward end of the cutter 30 collides with a substantial boundary portion 110 between the cover tape Cc and the carrier tape Ca. When the storage tape CX further moves in the arrow direction H from the state of FIG. 20, the edge 106 vertically divides the substantial boundary portion 110 between the cover tape Cc and the carrier tape Ca following the movement. The bottom worked surface 104 comes into contact with an end surface corner portion of the carrier tape Ca, and the cutter 30 runs onto the upper surface of the carrier tape Ca. When the cutter 30 runs onto the upper surface of the carrier tape Ca, the cutter 30 moves up by the difference between the heights of the edge 106 and the bottom surface 103 and the tape processing unit 28 also moves up following this, so that a small clearance is formed between the lower surface of a portion of the tape processing unit 28 upstream beyond the cutter 30 and the storage tape CX as a result. Around the component outlet port 65 of the downstream portion 28B of the tape processing unit 28 on the side downstream beyond the cutter 30, substantially no interval is present between the lower surface of the downstream portion 28B and the carrier tape Ca due to the inclination of the tape processing unit 28, and the carrier tape Ca is pressed by the tape processing unit from above. A step portion 28D whose lower surface is indented is formed on a downstream-side portion of the downstream portion 28B, and an interval is formed between the lower surface of this step portion 28B and the storage tape when moving. Consequently, the storage tape CX passing through the component outlet port 56 is not pressed by the tape processing unit 28, but smoothly moves toward the downstream side.

The cover tape Cc of the storage tape CX reaching the cutter 30 is not cut but moves on the upper worked surface 105 obliquely upward, and the tape enters a state of FIG. 21.

In other words, the cutter 30 is pressed downward by the springs along with the suppressor 43, and hence the same moves against this pressing force, to run onto the upper surface of the carrier tape Ca. While the edge 106 comes into contact with a central portion of the cover tape Cc in the width direction orthogonal to the feeding direction H, the edge 106 is linear while having a small dimension in the horizontal direction, whereby the edge can be avoided from staving and cutting the cover tape Cc. Consequently, the edge 106 and the upper worked surface 105 relatively advance with respect to the storage tape CX while lifting up the cover tape Cc. A left-side end portion of the cover tape Cc in FIG. 21 is not cut at least on the upper worked surface 105 but further moves up beyond the upper end of the upper worked surface 105, and is cut when reaching an upper portion of the angular blade portion 102 to some extent.

The cover tape Cc in FIG. 21 shows a state remaining on the blade portion 101 of the cutter without being cut, is cut on a side leftward beyond this portion, and hence not illustrated in FIG. 21. In other words, both sides of the cover tape Cc holding a component storage portion 13 are bonded to the carrier tape Ca, whereby tension increases every time the height lifted up by the cutter blade portion 101 increases. A portion where at least prescribed tension of the cover tape Cc is applied to the cutter blade portion 101 is cut and divided by the cutter blade portion 101.

FIG. 20 is a case where the height of the edge 106 on the forward end of the cutter 30 is the boundary between the cover tape Cc and the carrier tape Ca and the edge 106 hits the headmost end surface 11 of the storage tape CX on this boundary. The thickness of the cover tape Cc may vary with the type of the storage tape CX. The cutter 30 is mounted on the downwardly pressed tape processing unit 28 as described above. The storage tape CX is pressed downward by the tape processing unit 28 on the side upstream beyond the position (edge of the blade of the cutter) with which the cutter comes into contact until the edge 106 of the storage tape CX moving from the upstream side comes into contact with the cutter 30, and substantially no clearance is present between the storage tape CX and the tape processing unit 28. Therefore, the cutter 30 and the height of the upper surface of the storage tape CX are regularly kept in a certain positional relation.

Figure 22:
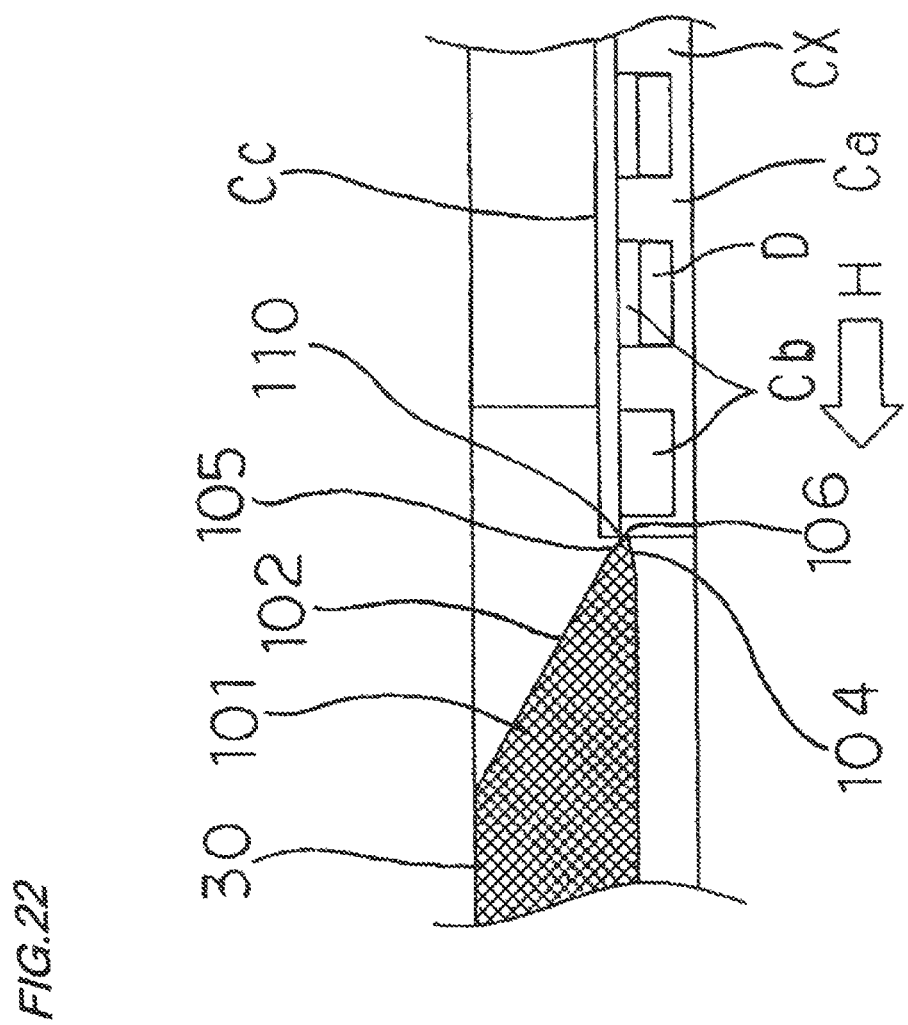
FIG. 22 is a diagram illustrating of a time when the edge of the cutter hits a portion slightly lower than the boundary between the cover tape and a carrier tape on the end surface of the storage tape.

Thus, the edge 106 of the blade of the cutter 30 collides with the same height position of the headmost end surface 11 of the storage tape CX, as shown in FIG. 20, for example. In a case where the cover tape Cc is thinner than FIG. 20, it follows that the edge 106 of the cutter blade portion 101 hits the end surface of the carrier tape Ca on a position slightly lower than the boundary portion 110 (between layers) between the cover tape Cc and the carrier tape Ca, as shown in FIG. 22.

In this case, the carrier tape Ca has rigidity to some extent while the cover tape Cc has no rigidity. The bottom worked surface 104 so presses/hits an inner portion around a corner portion of the carrier tape Ca due to the movement of the storage tape CX in the arrow H direction that the cutter 30 receives an upward force larger than a downward force. Therefore, the cutter 30 moves up to a position where the bottom surface 103 steps on the upper surface of the carrier tape Ca while the edge 106 of the blade portion 101 upwardly scrapes off the carrier tape Ca.

Similarly, also in a case where the storage tape CX is such an emboss tape that storage portions for electronic components are formed to protrude downward and storage portions of a carrier tape are covered with a cover tape, the bottom worked surface of the cutter presses/hits the inner portion around the corner portion of the carrier tape due to the movement of the storage tape in the downstream direction. The cutter receives the upward force larger than the downward force. Therefore, the cutter 30 moves up to the position where the bottom surface 103 steps on the upper surface of the carrier tape Ca while the edge 106 of the blade portion 101 upwardly scrapes off the carrier tape Ca or warps the same downward.

While the upper worked surface 105 (or further the angular blade portion 102) lifts up the cover tape Cc as shown in FIG. 21 on a portion upward beyond the carrier tape Ca in this moving-up process, the angular blade portion 102 cuts the cover tape Cc similarly to the above following the movement of the storage tape CX. At this time, the cutter 30 and the tape processing unit 28 move up against a downward pressing force according to the springs 61 and 62, and hence pressing for the storage tape CX by a positioning unit 35 slightly weakens, while the bottom surface 103 of the cutter 30 substitutionally presses the carrier tape Ca, whereby the pressing for the storage tape does not weaken as a whole.

Thus, the bottom worked surface 104 is so formed that the edge 106 of the cutter blade portion 101 keeps sticking into an intermediate portion of the end surface of the carrier tape Ca even if the thickness of the cover tape Cc is dispersed to some extent. The cutter 30 can be prevented from buckling the cover tape Cc and entering a state incapable of cutting the cover tape Cc or the blade forward end can be prevented from chipping.

Also in a case where the edge 106 which is the edge of the cutter 30 hits the head end surface 11 of the storage tape CX on a position slightly upward beyond the boundary between the cover tape Cc and the carrier tape Ca, the cover tape Cc escapes upwardly and the blade forward end can enter a portion under the same if the former hits the latter under the end surface of the cover tape Cc. Therefore, the cutter 30 is preferably so provided on the tape processing unit 28 that the position where the edge 106 of the cutter 30 having the bottom worked surface 104 hits the storage tape CX becomes a height position substantially at the center of dispersion tolerance for these.

In the storage tape CX, the headmost storage recess portion Cb is preferably made to store no electronic component D, as shown in FIGS. 20 to 22.

Thus, also in a case where the cutter 30 hits a portion downwardly beyond the boundary portion 110 in particular when the edge 106 of the cutter 30 collides with the head end surface 111 of the storage tape CX, enters the space between the cover tape Cc and the carrier tae Ca from the end surface and cuts open the cover tape Cc, the cutter 30 can reliably avoid hitting the electronic components, and such a situation can be avoided that the cutter 30 hits the electronic components. The movement of the storage tape stops and a supply anomaly of electronic component takes place.

Then, the control unit 79 performs a pitch feeding operation for cuing the position of a storage recess portion Cb, which is a second one from the forward end of the storage tape CX and in which an electronic component is stored, into the component adsorption/extraction position PU by a prescribed number of times. In this case, the control unit 79 executes a prescribed feeding operation for carrying the position of the storage recess portion Cb to the component adsorption/extraction position PU according to the feed pitch, according to the accumulated feed rate (quantity of driving/management of the servomotor 32 resulting from engagement of the tape feeding teeth of the second sprocket 27 with the feeding holes Cd) from the position of the previous definition of the forward end position of the storage tape CX.

The control unit 79 performs this automatic matching of the position of the storage recess portion Cb by controlling the feed rate due to the positional relation of the storage recess portion Cb according to taping standards on the basis of a cut position of the forward end of the storage tape CX according to the criterion of the feeding holes Cd.

While the tape processing unit 28 is so supported by the suppressor 43 that the height on the inlet side (upstream side) is larger than that on the outlet side (downstream side) and obliquely lowers from the inlet side toward the outlet side (from the right side toward the left side in FIG. 7) in the aforementioned embodiment of the present disclosure, the suppressor 43 may be horizontally supported, the tape processing unit may be horizontally supported on this suppressor 43, and the tape processing unit may be so formed that the thickness thereof gradually increases from the inlet side toward the downstream side, for example. In other words, the interval between the lower surface of the tape processing unit 28 and the horizontal chute upper surface 500 on the upstream side is larger than the thickness of the storage tape CX. The lower surface of the tape processing unit 28 obliquely lowers from the inlet side toward the outlet side, and the lower surface of the tape processing unit 28 is oblique with respect to the chute upper surface 500. The chute upper surface 500, i.e., a receiving surface for the storage tape CX is a surface substantially horizontal from the upstream side up to the downstream side. Therefore, the lower surface of the tape processing unit 28 may be so formed that the interval between the lower surface of the tape processing unit 28 and the chute upper surface 500 gradually lessens from the inlet side toward the outlet side without tilting the suppressor 43 and the tape processing unit 28 and the interval between the tape processing unit 28 and the storage tape CX becomes substantially zero on a side closer to the inlet than the cutter 30. Further, the thickness of the guide section 280 may be made to gradually increase from the upstream side toward the downstream side so that the guide section 280 which is the upstream-side portion of the suppressor 43 is also horizontally supported and the lower surface of the guide section 280 gradually lessens from the inlet side toward the outlet side.

Figure 18:
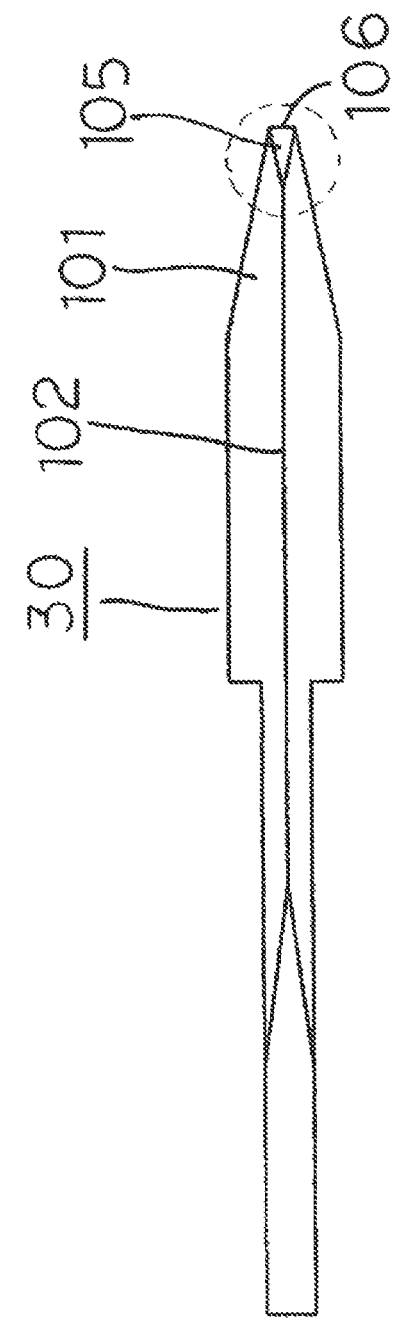
FIG. 18 is a top plan view of the cutter.
Figure 19:
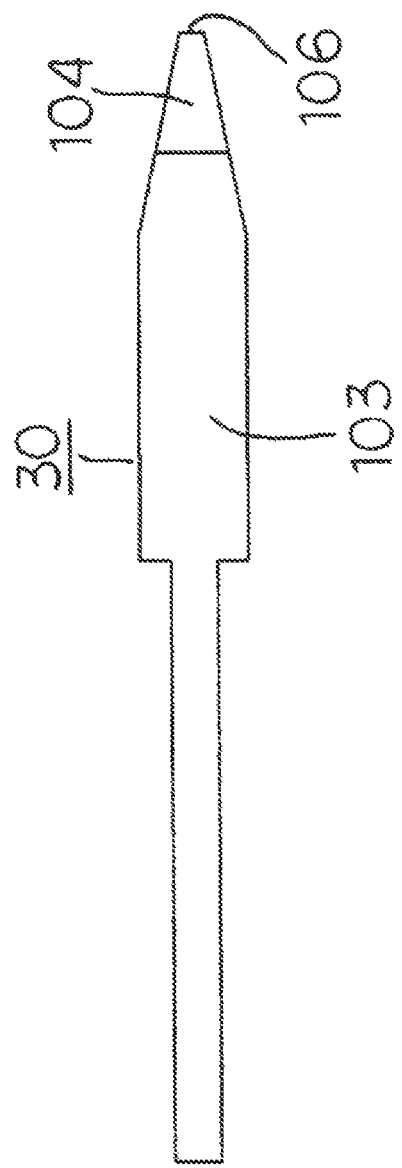
FIG. 19 is a bottom plan view of the cutter.
Figure 25:
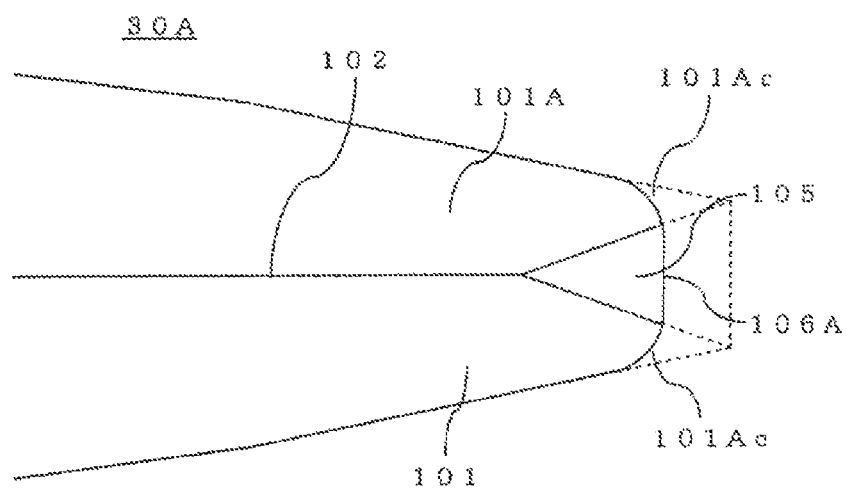
FIG. 25 is a top plan view of another example of the cutter.
Figure 26:
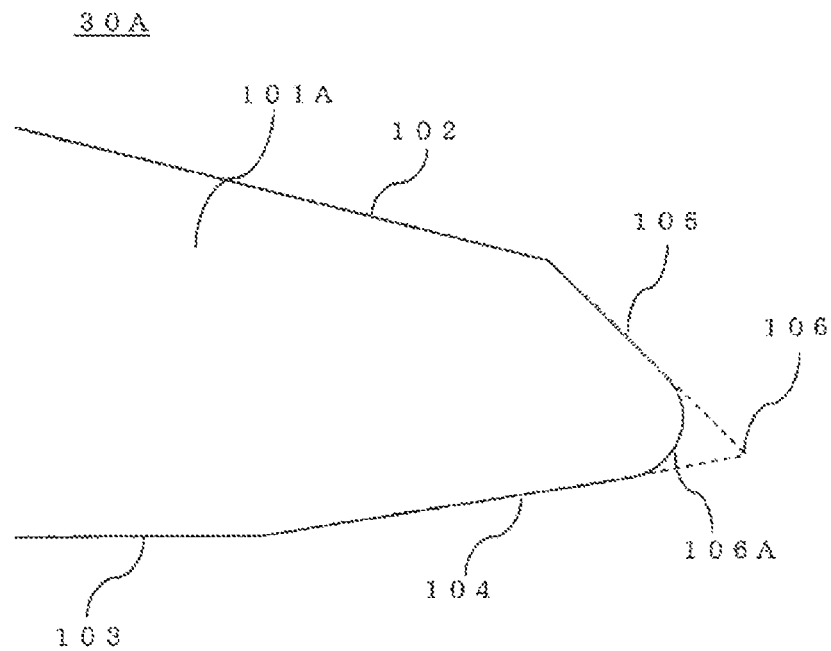
FIG. 26 is a side elevational view of the other example of the cutter.

Another example 30A of the cutter is now described by employing FIGS. 25 to 28. This example is similar to the aforementioned embodiment, except for the cutter 30. FIGS. 25 and 26 show enlarged diagrams of a broken line circle portion shown in FIG. 18 which is the top plan view of the cutter 30, which is the preceding example. FIG. 25 shows a top plan view of the cutter 30A similarly to FIG. 18, and FIG. 26 shows a side elevational view thereof. Referring to FIGS. 25 and 26, broken lines show the shape of the blade portion 101 of the preceding example, while identical signs are assigned to elements when the same are in the same structures as those in the preceding example, and suffixes A are assigned to identical signs when the same are in different structures.

Points of the other example different from the preceding example are an edge 106A of the cutter 30A and a blade portion 101A, as understood also from FIGS. 25 and 26 and signs thereof. While the edge 106 of the forward end portion of the blade portion 101 of the preceding example, i.e., the forward end of the upper worked surface 105 (flat portion) has a small prescribed thickness dimension and is linearly in an orthogonal direction of the transportation direction for the storage tape CX, the forward end portion of the blade portion 101A of the other example has the so-called R shape (second R shape, fourth R shape) in which a vertical section in the longitudinal direction of the cutter, i.e., the transportation direction for the storage tape CX is rounded, as described previously. For example, R chamfering of at least about R0.03 mm is performed.

While the blade portion 101 of the cutter 30 of the preceding example is C-chamfered at a sharp angle from both ends of the forward end of the upper worked surface 105 (flat portion) in the downstream direction for transporting the storage tape CX, the forward end portion of the blade portion 101A has the so-called rounded R shape portions 101Ac (first R shape) extending from both ends of the forward end of the edge 106A, i.e., the forward end of the upper worked surface 195 (flat portion) in the orthogonal direction of the transportation direction for the storage tape CX respectively. In order to bring the R shape portions 101Ac into this rounded shape, R chamfering of at least about R0.02 mm in plan view shown in FIG. 25 is performed, for example.

Figure 27:
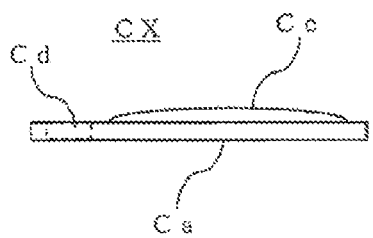
FIG. 27 is a diagram of the storage tape fed in a floating state as viewed from the cutter.
Figure 28:
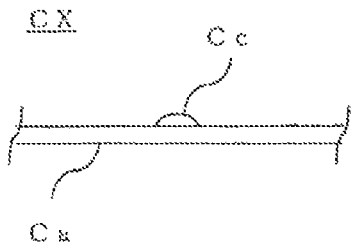
FIG. 28 is a diagram of the storage tape fed in the floating state as viewed from a side surface side of the component supply unit.

The other example attains the following effect:

In the storage tape CX fed to the cutter 30A, there is a case where the cover tape Cc is fed while floating with a certain width. FIGS. 27 and 28 show an example thereof, FIG. 27 is a diagram of the storage tape CX fed in the floating state as viewed from the cutter, and FIG. 28 is a diagram of this state as viewed from a side surface side of the component supply unit.

As a cause for the floating, winding of the storage tape CX on the storage tape reel is firstly listed. This is because the posture changes from an arcuate state to a linear state when the wound storage tape CX is delivered from the storage tape reel and inserted into the component supply unit 5. The floating probability is higher in a storage tape CX whose wound radius on the storage tape reel is in a smaller state.

As another cause, a case where the operator gives abrupt bending to the storage tape CX when handling the storage tape CX is conceivable.

At a time when such floating takes place, the R shape portions 101Ac of the blade portion 101A and the edge 106A of the rounded shape can separate the cover tape Cc from the carrier tape Ca without staving the floating portion of the cover tape Cc in the other example. The cover tape Cc has a thickness of about 0.05 mm to 0.07 mm, and there is resin such as polypropylene or polyamide, for example, as the material therefor.

In particular, the effect of the R shape portions 101Ac of the blade portion 101A is large. Therefore, the edge 106A may not necessarily have the R shape.

Figure 29:
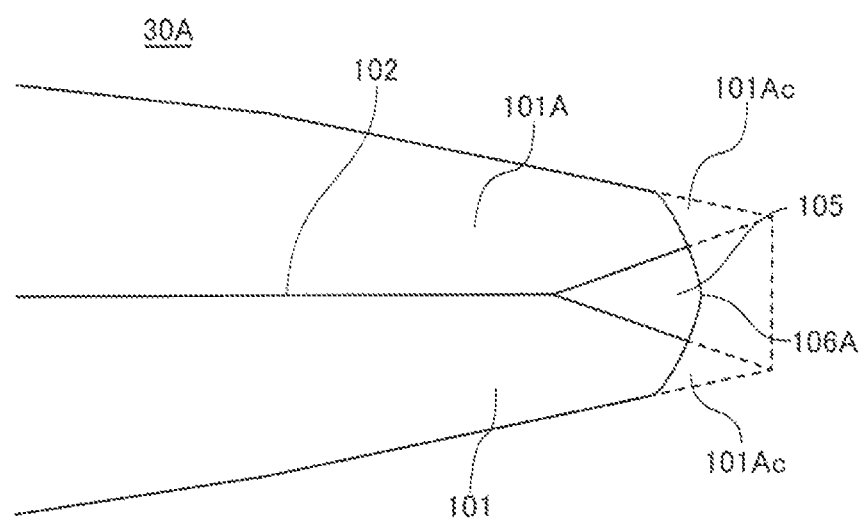
FIG. 29 is a top plan view of another example of the cutter.

While the edge 106A, as shown in FIG. 29, has been in the linear shape having the certain width in the orthogonal direction of the transportation direction for the storage tape CX, the same may have a rounded shape (third R shape) integrated with the rounded shape of the rounded shape portions 101Ac also in the horizontal direction of the transportation direction for the storage tape CX. Further, a ridge portion on the outer periphery of the C-chamfered upper worked surface 105 may also be chamfered in a rounded shape.

While the embodiment of the present disclosure has been described in the aforementioned manner, various substitutional examples, corrections or modifications are possible for those skilled in the art on the basis of the above description, and the present disclosure includes the aforementioned various substitutional examples, corrections or modifications in a range not deviating from the subject matter thereof.

What is claimed is:

1. A component supply unit intermittently supplying an electronic component stored in a storage portion of a storage tape to a component extraction position by rotation of a sprocket while a feeding tooth thereof fits with a feeding hole formed on the storage tape, said component supply unit comprising:
    a tape processing unit including a cutter successively cutting a cover tape covering the storage portion of the storage tape along a traveling direction following traveling of the storage tape and a guide surface guiding the cover tape cut by the cutter to successively cut open the cover tape following the traveling of the storage tape,
    the cutter including a blade portion having an angular blade portion inclined frontwardly downward to form a blade, and an upper flat portion having a width in a horizontal direction gradually narrowing upwardly from a lower, forward end of the upper flat portion to reach the angular blade portion on an upper end on a forward end portion of the blade portion,
    a bottom flat portion narrowing upwardly to the upper flat portion in a direction opposite to the traveling direction of the storage tape and the upper flat portion narrowing along the traveling direction of the storage tape.

2. A component supply unit supplying an electronic component stored in a storage portion of a storage tape intermittently to a component extraction position by rotation of a sprocket while a feeding tooth thereof fits with a feeding hole formed on the storage tape, said component supply unit comprising
    a tape processing unit including a cutter successively cutting a cover tape covering the storage portion of the storage tape along a traveling direction following traveling of the storage tape and a guide surface guiding the cover tape cut by the cutter to successively cut open the cover tape following the traveling of the storage tape,
    the cutter including a blade portion having an angular blade portion inclined frontwardly downward to form a blade, and an upper flat portion directed upwardly from a lower, forward end of the upper flat portion for guiding the cover tape up to an edge angular blade portion formed on a forward end portion of the blade portion, a bottom flat portion narrowing upwardly to the upper flat portion in a direction opposite to the traveling direction of the storage tape and the upper flat portion narrowing along the traveling direction of the storage tape.

3. The component supply unit according to claim 1, wherein the upper flat portion is an isosceles triangle having a lower end of the angular blade portion as a vertex.

4. The component supply unit according to claim 1, wherein the forward end portion of the blade portion has respective rounded shape portions extending from both ends of a forward end of the upper flat portion in an orthogonal direction to a transportation direction for the storage tape.

5. The component supply unit according to claim 4, wherein a forward end of the upper flat portion has a shape in which perpendicular sections in the transportation direction for the storage tape are rounded.

6. The component supply unit according to claim 5, wherein the forward end of the upper flat portion is integrated with the rounded shape portions of the forward end portion of the blade portion and has a rounded shape in the orthogonal direction to the transportation direction for the storage tape.

7. The component supply unit according to claim 1, wherein a forward end of the upper flat portion has a prescribed thickness dimension and is linear in an orthogonal direction to a transportation direction for the storage tape in the blade portion, and the blade portion is C-chamfered at a sharp angle from both ends of the forward end of the upper flat portion in a downstream direction for transporting the storage tape.

8. The component supply unit according to claim 7, wherein the forward end of the upper flat portion has a shape in which a vertical section in the transportation direction for the storage tape is rounded.

* * * * *